United States Patent
Aiouaz et al.

(10) Patent No.: US 11,995,340 B2
(45) Date of Patent: May 28, 2024

(54) READ-DISTURB-BASED READ TEMPERATURE INFORMATION ACCESS SYSTEM

(71) Applicant: Dell Products L.P., Round Rock, TX (US)

(72) Inventors: Ali Aiouaz, Bee Cave, TX (US); Walter A. O'Brien, III, Westborough, MA (US); Leland W. Thompson, Tustin, CA (US); James Ulery, Eastvale, CA (US)

(73) Assignee: Dell Products L.P., Round Rock, TX (US)

( * ) Notice: Subject to any disclaimer, the term of this patent is extended or adjusted under 35 U.S.C. 154(b) by 142 days.

(21) Appl. No.: 17/579,282

(22) Filed: Jan. 19, 2022

(65) Prior Publication Data

US 2023/0244410 A1    Aug. 3, 2023

(51) Int. Cl.
*G06F 3/06* (2006.01)

(52) U.S. Cl.
CPC .......... *G06F 3/0655* (2013.01); *G06F 3/0604* (2013.01); *G06F 3/0653* (2013.01); *G06F 3/0679* (2013.01)

(58) Field of Classification Search
CPC .... G06F 3/0655; G06F 3/0679; G06F 3/0653; G06F 3/0604
See application file for complete search history.

(56) References Cited

U.S. PATENT DOCUMENTS

| | | | |
|---|---|---|---|
| 8,566,371 B1 | 10/2013 | Bono et al. | |
| 10,372,382 B2 * | 8/2019 | Alavi | G06F 11/004 |
| 11,586,385 B1 * | 2/2023 | Lercari | G06F 3/0659 |
| 2017/0371559 A1 | 12/2017 | Higgins et al. | |
| 2021/0318827 A1 * | 10/2021 | Bernat | G06F 12/0246 |

\* cited by examiner

*Primary Examiner* — Mark A Giardino, Jr.
(74) *Attorney, Agent, or Firm* — Joseph Mencher

(57) ABSTRACT

A read-disturb-based read temperature information access system includes a read-disturb-based read temperature information management subsystem coupled to a plurality of storage devices that each include a read-disturb-based read temperature information Application Programming Interface (API). Each storage device generates and stores read-disturb-based read temperature information associated with that storage device, and when a read-disturb-based read temperature information command is received from the read-disturb-based read temperature information management subsystem that conforms to the read-disturb-based read temperature information API, the storage device receiving that read-disturb-based read temperature information command will execute it to perform at least one operation using the read-disturb-based read temperature information associated with and stored by that storage device.

20 Claims, 22 Drawing Sheets

READ-DISTURB-BASED READ TEMPERATURE INFORMATION ACCESS SYSTEM

BACKGROUND

The present disclosure relates generally to information handling systems, and more particularly to accessing read-disturb-based read temperature information in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices and/or storage systems, and/or other computing devices known in the art, includes storage systems having one or more storage devices (e.g., Solid State Drive (SSD) storage devices) for storing data generated by the computing device. In some situations, it may be desirable to identify how often logical storage locations associated with any storage device are read. For example, different storage devices with different capabilities are associated with different costs (e.g., storage devices with relatively "higher" capabilities are more expensive than storage devices with relative "lower" capabilities), while different data stored in a storage system may have different characteristics, with some data being read relatively often (also referred to as data having a relatively "hot" read temperature) and other data being read relatively less often (also referred to as data having a relatively "cold" read temperature). As will be appreciated by one of skill in the art in possession of the present disclosure, financial margins of storage providers (e.g., entities that provide storage for customers) may be improved by offering particular storage Service Level Agreements (SLAs) while using relatively cheaper storage devices, and value can be passed on to customers by providing improved storage SLAs for data with relatively "hot" read temperatures without incurring higher costs for all storage devices in the storage system (e.g., by storing data with relatively "hot" read temperatures on relatively higher capability/cost storage devices, and storing data with relatively "cold" read temperatures on relatively lower capability/cost storage devices).

Conventional read temperature identification systems typically utilize a host processor (or a storage processor) and a host memory in a server device and/or storage system to identify read temperatures of logical storage locations in SSD storage device(s) included in, connected to, and/or otherwise coupled to that server device and/or storage system. For example, a Logical Block Address (LBA) range may be divided into smaller address ranges or logical "chunks" (e.g., 128 KB chunks). A counter (e.g., a Dynamic Random Access Memory (DRAM) counter) in the host memory may then be assigned to track read access to each logical chunk, and when the host processor performs read operations to read data from each of the SSD storage device(s) in the server device and/or storage system, the host processor will map the LBA range of that read operation to the corresponding logical chunk(s) being read, and increment the counter(s) for those physical storage element chunk(s) in the host memory. However, such conventional read temperature identification systems suffer from a number of issues.

For example, the conventional read temperature identification systems discussed above require dedicated host memory (e.g., for a 16 TB SSD storage device with 128 KB logical chunks, 32 MB of dedicated host memory is required if 8 bit counters are utilized), and the read temperature information identified will not be power-fail safe without a persistent power implementation (e.g., a battery backup, the use of Storage Class Memory (SCM) devices, etc.), each of which increases costs. In another example, the conventional read temperature identification systems discussed above increase complexity, as for a High Availability (HA) system each of multiple host processors included in a server device and/or storage system must generate its own read temperature map that tracks read temperatures of its storage devices in that server device and/or storage system, and then those host processors must synchronize their respective read temperature maps. Further complexity may be introduced when more Input/Output (I/O) initiators are utilized (e.g., when additional host processors are utilized in Non-Volatile Memory express over Fabrics (NVMe-oF) Just a Bunch Of Drives (JBOD) systems, disaggregated storage systems, and/or other systems that would be apparent to one of skill in the art in possession of the present disclosure).

In yet another example, the conventional read temperature identification systems discussed above may be inaccurate in some situations, as read temperature identification operations may be performed "in the background" with a "best effort" approach, and when host processors in a server device and/or storage system are busy performing other operations, those read temperature identification operations may not be performed in order to prevent I/O latency and/or other performance issues. While the host processors in a server device and/or storage system may sometimes only delay the read temperature identification operations in those situations, in some cases the read temperature identification operations may simply not be performed. In yet another example, the conventional read temperature identification systems discussed above can introduce a performance impact to data path(s) in a server device and/or storage system due to the use of the host processor and the host memory bus in performing the read temperature identification (e.g., via Read Modify Write (RMW) operations to provide these relatively small read temperature data writes via 64 byte cache line host memory entries, resulting in increased cache thrashing operations).

One conventional read temperature identification solution to the issues discussed above is to assume or characterize (a priori) the read temperatures of a storage device based on the type of data being read (e.g., metadata vs customer data), the type of application instructing the read operation (e.g., Relational Database Management System (RDBMS) applications vs. social media post applications (e.g., applications provided "tweets" via the TWITTER® social networking service available from TWITTER® of San Francisco, California, United States) vs. video streaming applications), the type of workload being performed (e.g., 4K vs. 8K video streaming workloads, sequential access vs. random access workloads, etc.). However, such conventional read temperature identification solutions suffer from a number of issues as well.

For example, the conventional read temperature identification solutions discussed above require pre-qualification or classification of data attributes, and cannot provide granularity beyond the particular classification that is used. In another example, conventional read temperature identification solutions do not allow for sub-classifications of data (e.g., a video type of the read data) that may be useful, will not allow data (e.g., video data such as that providing a movie) that is read often to be provided on a faster storage device or replicated at additional storage locations, and present issues with tracking effective "hits" per storage device and load balancing (as conventional read temperature identification solutions are typically limited to tracking data requests (e.g., video data requests) at the application level). In yet another example, conventional read temperature identification solutions require modification of software when new types of data, applications, and/or workloads are introduced and, as such, are less resilient with regard to optimizing read performance for use cases that emerge over time, and present additional costs associated with research and development to qualify new workloads or applications, develop software, test that software, perform software patch updates on server devices and/or storage systems that will use that software, and/or introduce other added cost factors that would be apparent to one of skill in the art in possession of the present disclosure.

Accordingly, it would be desirable to provide read temperature identification system that addressees the issues discussed above.

SUMMARY

According to one embodiment, a storage device includes a processing system; and a memory system that is coupled to the processing system and that includes instructions that, when executed by the processing system, cause the processing system to provide a read-disturb-based read temperature information access engine that includes a read-disturb-based read temperature information Application Programming Interface (API) and that is configured to: generate and store read-disturb-based read temperature information associated with the storage device; receive, from a read-disturb-based read temperature information management subsystem, a read-disturb-based read temperature information command that conforms to the read-disturb-based read temperature information API; and execute the read-disturb-based read temperature information command that conforms to the read-disturb-based read temperature information API and, in response, perform at least one operation using the read-disturb-based read temperature information associated with and stored by the storage device.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
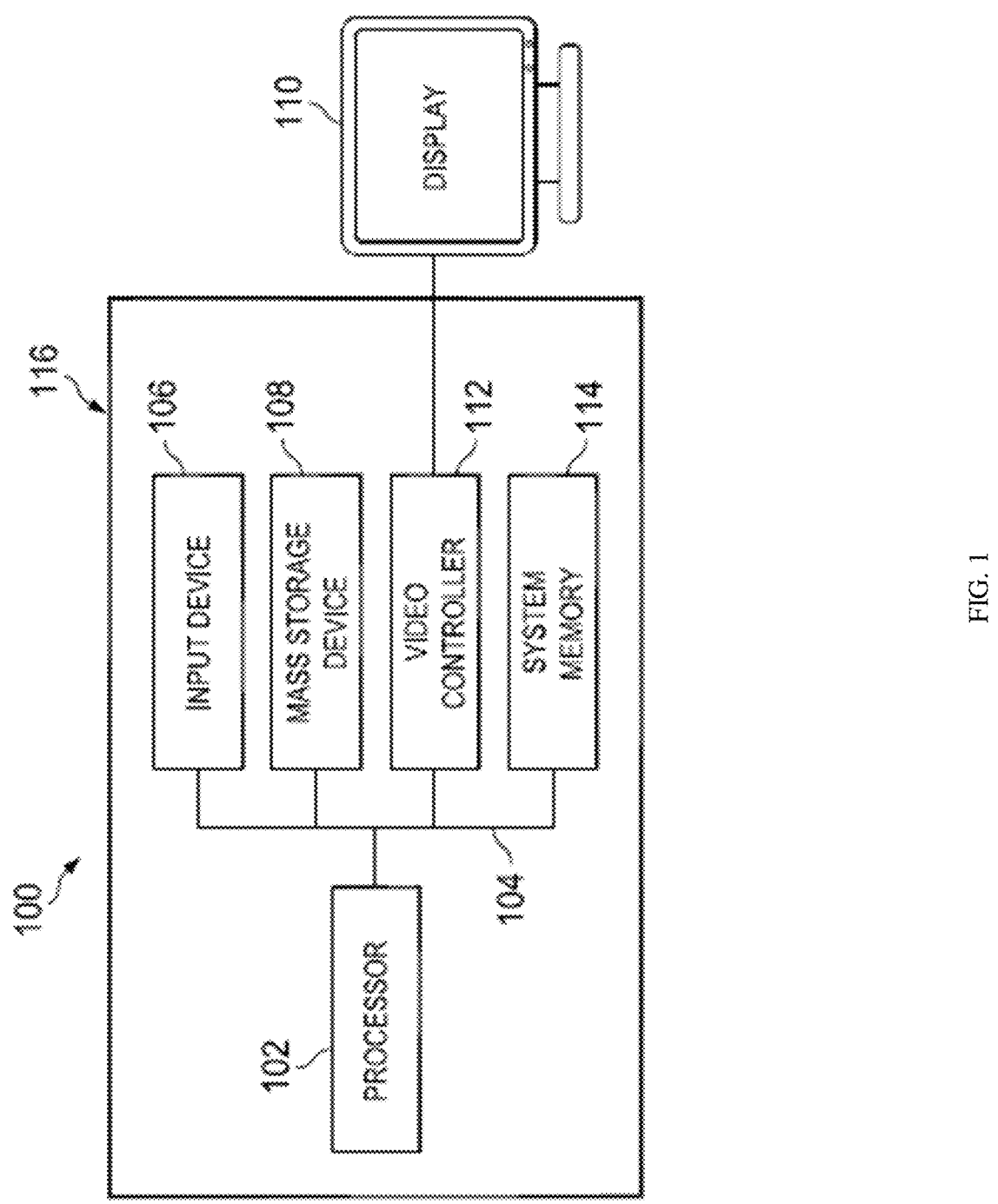
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
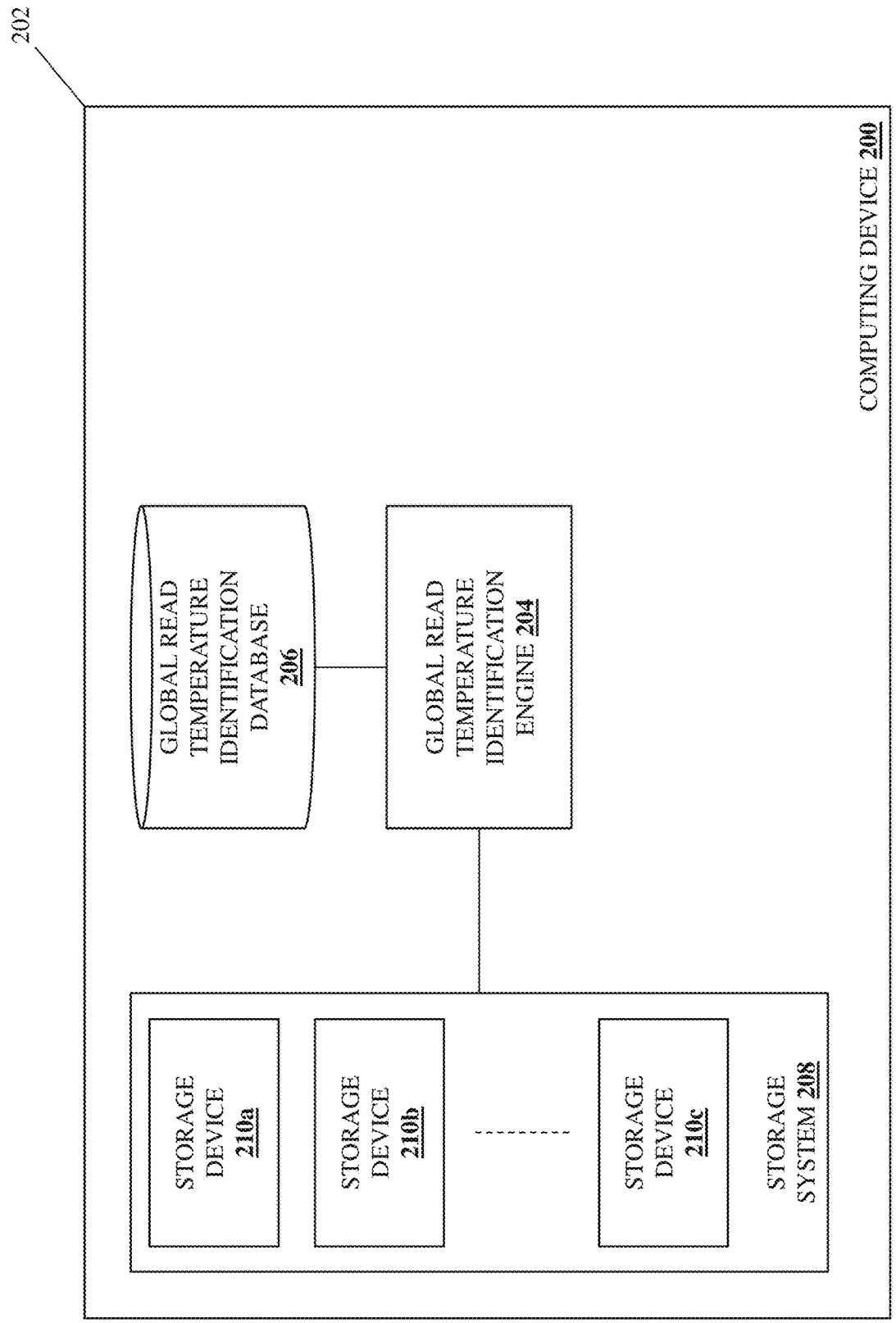
FIG. 2 is a schematic view illustrating an embodiment of a computing device that may include the read-disturb-based read temperature identification system of the present disclosure.

Referring now to FIG. 2, an embodiment of a computing device 200 is illustrated that may include the read-disturb-based read temperature identification system of the present disclosure. In an embodiment, the computing device 200 may be provided by the IHS 100 discussed above with reference to FIG. 1 and/or may include some or all of the components of the IHS 100, and in the specific examples below is illustrated and described as being provided by a server device and/or a storage system. However, while illustrated and discussed as being provided by particular computing devices, one of skill in the art in possession of the present disclosure will recognize that the functionality of the computing device 200 discussed below may be provided by other devices that are configured to operate similarly as the computing device 200 discussed below. In the illustrated embodiment, the computing device 200 includes a chassis 202 that houses the components of the computing device 200, only some of which are illustrated and discussed below. For example, the chassis 202 may house a processing system (not illustrated, but which may include the processor 102 discussed above with reference to FIG. 1 that may be provided by a Central Processing Unit (CPU) and/or other processing systems that one of skill in the art in possession of the present disclosure would recognize as providing a computing device host processor) and a memory system (not illustrated, but which may include the memory 114 discussed above with reference to FIG. 1) that is coupled to the processing system and that includes instructions that, when executed by the processing system, cause the processing system to provide a global read temperature identification engine 204 that is configured to perform the functionality of the global read temperature identification engines and/or computing devices discussed below.

The memory system housed in the chassis 202 may also include a global read temperature identification database 206 that is configured to store any of the information utilized by the global read temperature identification engine 204 discussed below. The chassis 202 may also house a storage system 208 that, in the illustrated embodiment, includes a plurality of storage devices 210a, 210b, and up to 210c. In the specific examples below, each of the storage devices 210a-210c in the storage system 208 are described as being provided by particular Solid State Drive (SSD) storage devices, but one of skill in the art in possession of the present disclosure will appreciate how the teachings of the present disclosure may benefit other storage device technologies, and thus storage devices utilizing those other types of storage device technologies are envisioned as falling within the scope of the present disclosure as well. However, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, as well as the functionality discussed below, while remaining within the scope of the present disclosure as well.

Figure 3A:
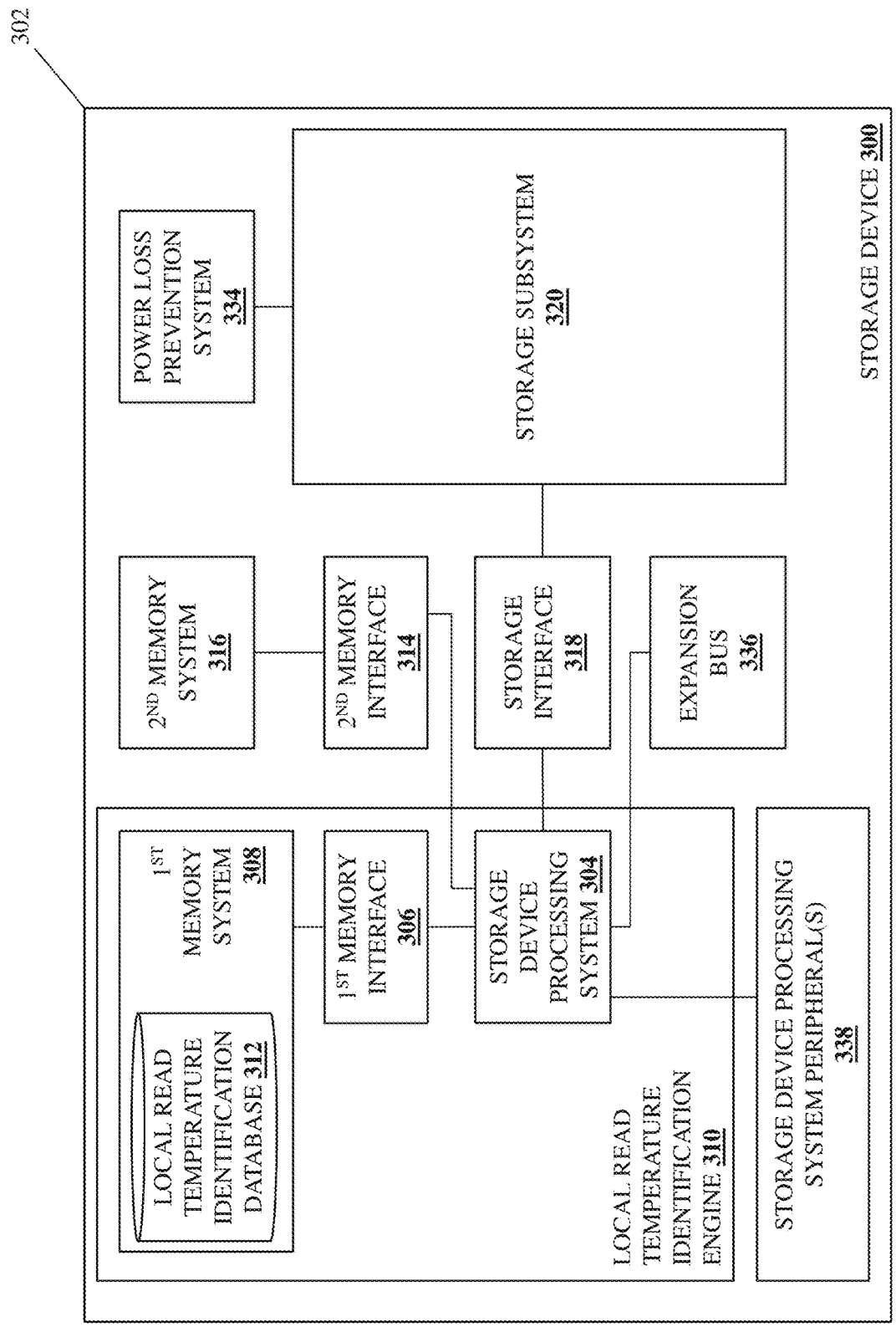
FIG. 3A is a schematic view illustrating an embodiment of a storage device that may be included in the computing device of FIG. 2 and that may provide the read-disturb-based read temperature identification system of the present disclosure.

Referring now to FIG. 3A, an embodiment of a storage device 300 is illustrated that may provide any or each of the storage devices 210a-210c in the storage system 208 discussed above with reference to FIG. 2. In an embodiment, the storage device 300 may be provided by the IHS 100 discussed above with reference to FIG. 1 and/or may include some or all of the components of the IHS 100, and in the specific examples below is illustrated and described as being provide by an SSD storage device (e.g., a Non-Volatile Memory express (NVMe) SSD storage device). However, while illustrated and discussed as being provided by a particular storage device, one of skill in the art in possession of the present disclosure will appreciate that the teachings of the present disclosure may be implemented in other storage devices that are configured to operate similarly as the storage device 200 discussed below. In the illustrated embodiment, the storage device 200 includes a chassis 302 that houses the components of the storage device 300, only some of which are illustrated and discussed below.

For example, the chassis 302 may house a storage device processing system 304 (which may include the processor 102 discussed above with reference to FIG. 1 such as a Central Processing Unit (CPU), storage device controller, and/or other processing systems that one of skill in the art in possession of the present disclosure would recognize as being provided in an SSD storage device) that is coupled via a first memory interface 306 (e.g., a Dual Data Rate (DDR) interface) to a first memory system 308 (which may include the memory 114 discussed above with reference to FIG. 1 such as Dynamic Random Access Memory (DRAM) devices and/or other memory systems that would be apparent to one of skill in the art in possession of the present disclosure). As illustrated in the specific examples provided herein, the first memory system 308 may include instructions that, when executed by the storage processing system 304, cause the storage device processing system 304 to provide a local read temperature identification engine 310 that is configured to perform the functionality of the local read temperature identification engines and/or storage devices discussed below.

As also illustrated in the specific examples provided herein, the first memory system 308 may include a local read temperature identification database 312 that is configured to store any of the information utilized by the local read temperature identification engine 310 discussed below. However, one of skill in the art in possession of the present disclosure will recognize that other embodiments of the present disclosure may provide the local read temperature identification database 312 in other locations while remaining within the scope of the present disclosure as well. For example, as illustrated, the storage device processing system 304 may also be coupled via a second memory interface 314 (e.g., a Storage Class Memory (SCM) interface) to a second memory system 316 (which may include the memory 114 discussed above with reference to FIG. 1 such as SCM devices and/or other memory systems that would be apparent to one of skill in the art in possession of the present disclosure), and the local read temperature identification database 312 may be provided by the second memory system 316 while remaining within the scope of the present disclosure as well.

Figure 3B:
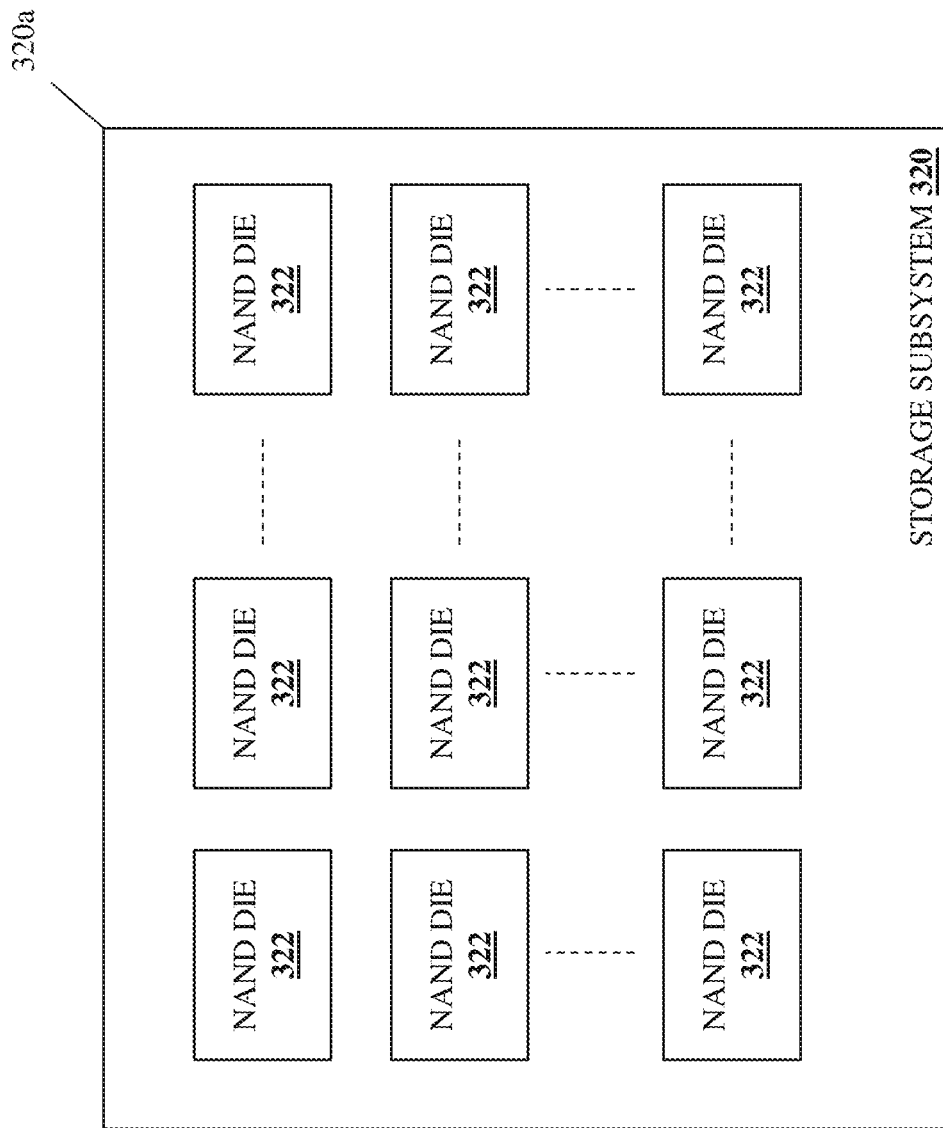
FIG. 3B is a schematic view illustrating an embodiment of a storage subsystem that may be included in the storage device of FIG. 3A.
Figure 3C:
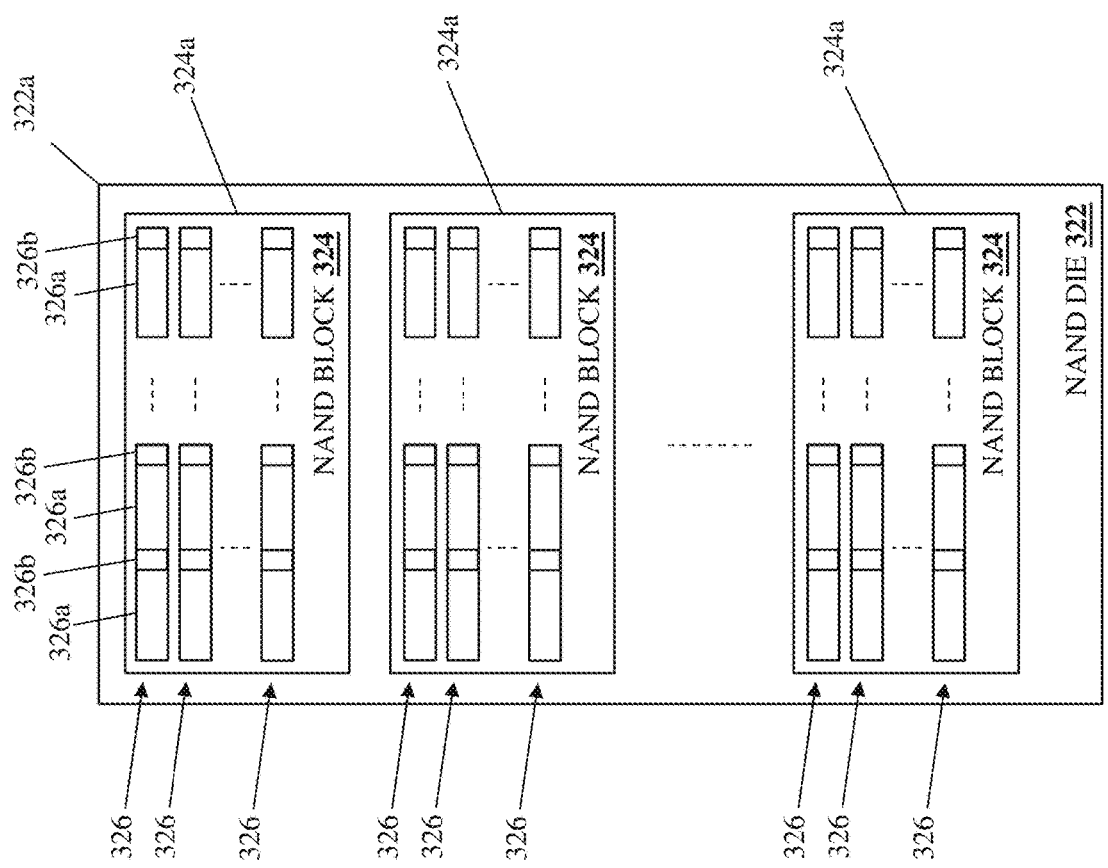
FIG. 3C is a schematic view illustrating an embodiment of NAND die that may be included in the storage subsystem of FIG. 3B.

The storage device processing system 304 may also be coupled via a storage interface 318 to a storage subsystem 320. With reference to FIG. 3B, in some embodiments, the storage subsystem 320 may include a storage subsystem chassis 320a that supports a plurality of NAND die 322. With reference to FIG. 3C, each NAND die 322 may include a chassis 322a that supports a plurality of NAND blocks 324, with each NAND block 324 including a chassis 324a that supports a plurality of NAND wordlines 326. Furthermore, each NAND wordline 326 may include a plurality of cells that provide a plurality of data portions 326a, and a respective error check portion 326b (e.g., a Cyclic Redundancy Check (CRC)portion and/or other error check data known in the art) may be associated with each of those data portions 326a. However, one of skill in the art in possession of the present disclosure will appreciate how in some embodiments the data written to a NAND block 324 may include "padding" data or other data which conventionally does require the writing of associated error check portions.

To provide a specific example, the storage subsystem 320 may include 128, 256, or 512 NAND die, with each NAND die including approximately 2000 NAND blocks, and with each NAND block including NAND wordlines grouped into 100-200 NAND layers (although forecasts predict that NAND wordlines will be grouped into up to 800 layers by the year 2030). As will be appreciated by one of skill in the art in possession of the present disclosure, conventional Triple Level Cell (TLC) technology typically allows on the order of tens to hundreds of K of data (e.g., 96 KiB on a NAND wordline, 48 KiB on a NAND wordline with two NAND wordlines activated at any particular time, up to hundreds of KiB when more planes are utilized, etc.) to be stored per NAND wordline (i.e., in the data portions of those NAND wordlines), resulting in NAND wordlines with ~250K cells.

Figure 3D:
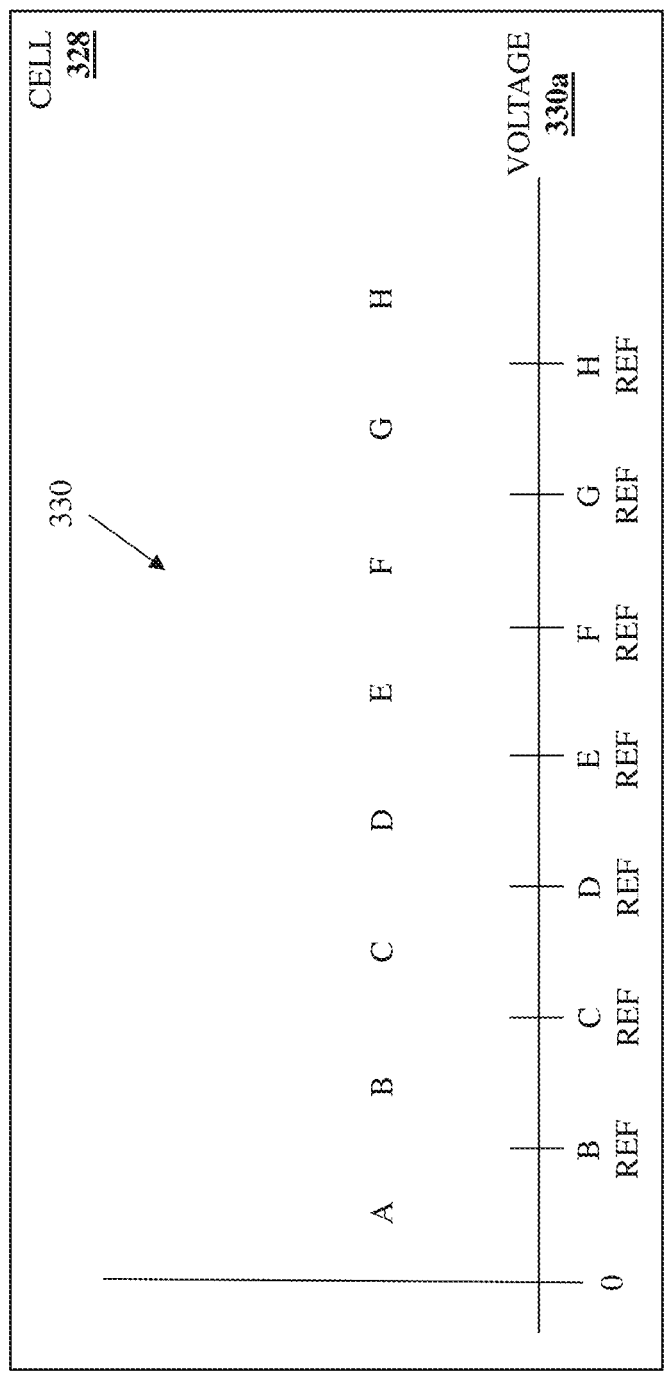
FIG. 3D is a graph view illustrating an embodiment of voltages/values available in a cell of a NAND wordline in a NAND block that is included in the NAND die of FIG. 3C.
Figure 3E:
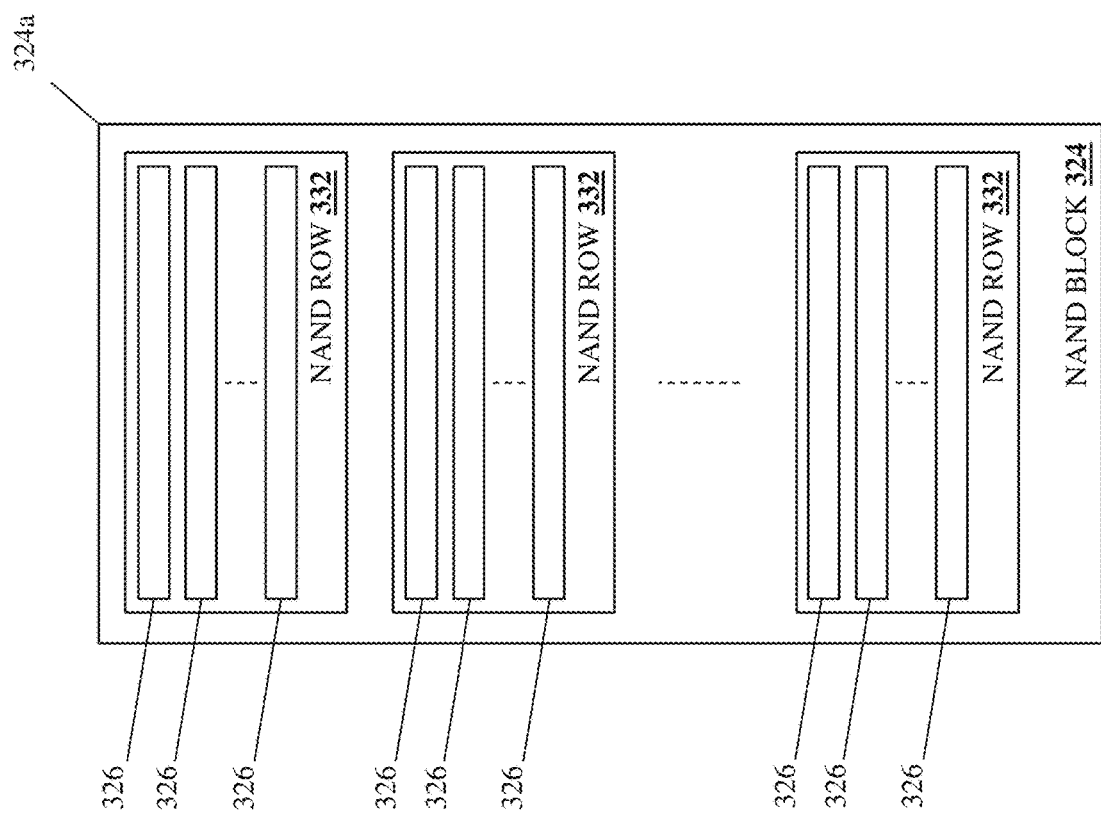
FIG. 3E is a schematic view illustrating an embodiment of a NAND block that is abstracted with "NAND rows" for purposes of describing different embodiments the read-disturb-based read temperature identification system of the present disclosure.

With reference to FIG. 3D, a simplified representation of how data may be stored in a cell 328 is provided, and one of skill in the art in possession of the present disclosure will appreciate how data may be stored in any of the plurality of cells in any of the plurality of NAND wordlines discussed above in the manner described below. The data storage representation of the cell 328 in FIG. 3D includes a graph 330 with voltage 330a on the X-axis, and illustrates how different voltages of the cell 228 may be associated with different values for that cell 328, which in specific example illustrated in FIG. 3E includes values "A", "B", "C", "D", "E", "F", "G", and "H". Furthermore, the data storage representation of the cell 328 also illustrated how reference voltages may be defined to distinguish whether a voltage in the cell provide a particular value, with a B reference ("B REF") distinguishing between a value "A" or a value "B" for the cell 328, a C reference ("C REF") distinguishing between a value "B" or a value "C" for the cell 328, a D reference ("D REF") distinguishing between a value "C" or a value "D" for the cell 328, an E reference ("E REF") distinguishing between a value "D" or a value "E" for the cell 328, an F reference ("F REF") distinguishing between a value "E" or a value "F" for the cell 328, a G reference ("G REF") distinguishing between a value "F" or a value "G" for the cell 328, an H reference ("H REF") distinguishing between a value "G" or a value "H" for the cell 328.

As such, when the cell 328 includes a voltage below "B REF" it will provide a value "A", when the cell 328 includes a voltage between "B REF" and "C REF" it will provide a value "B", when the cell 328 includes a voltage between "C REF" and "D REF" it will provide a value "C", when the cell 328 includes a voltage between "D REF" and "E REF" it will provide a value "D", when the cell 328 includes a voltage between "E REF" and "F REF" it will provide a value "E", when the cell 328 includes a voltage between "F REF" and "G REF" it will provide a value "F", when the cell 328 includes a voltage between "G REF" and "H REF" it will provide a value "G", when the cell 328 includes a voltage over "H REF" it will provide a value "H". While not illustrated or described in detail herein, one of skill in the art in possession of the present disclosure will appreciate that each value A-H illustrated in FIG. 3D may be configured to store more than one bit depending on the amount of voltage that is provided to indicate that value (e.g., a first voltage level between "B REF" and "C REF" will provide a first set of bits for the value "B", a second voltage level between "B REF" and "C REF" will provide a second set of bits for the value "B", and so on).

As will be appreciated by one of skill in the art in possession of the present disclosure, different storage device manufacturers/providers may configure the NAND wordlines/NAND layers in NAND blocks differently, with some storage devices including NAND blocks with separate NAND wordlines, some storage devices including NAND blocks with NAND layers that each include a plurality of NAND wordlines, and some storage devices including NAND blocks with groups of NAND layers that each include a plurality of NAND wordlines. As such, with reference to FIG. 3E, the present disclosure abstracts the physical implementation of NAND wordlines and NAND layers into "NAND rows", with each NAND block 324 discussed in the examples below including a plurality of NAND rows 332. In other words, any one of the NAND rows 332 may include NAND wordline(s), NAND layer(s) each including a plurality of NAND wordlines, or group(s) of NAND layers that each include a plurality of NAND wordlines. As will be appreciated by one of skill in the art in possession of the present disclosure, the read disturb signatures discussed below may vary based on the design of the storage subsystem/storage device, as it may effect a NAND wordline or group of NAND wordlines, and thus the abstraction of the physical implementation of NAND wordlines into NAND rows is provided to simplify the discussion below while encompassing such different storage subsystem/storage device designs.

However, while the specific examples discussed above describes the storage device 300 as including the storage interface 318 that may be provided by a flash device interface and the storage subsystem 320 that is described as being provided by NAND devices (e.g., NAND flash devices), one of skill in the art in possession of the present disclosure will appreciate how the teachings of the present disclosure may benefit other storage technologies, and thus storage devices utilizing those other types of storage technologies are envisioned as falling within the scope of the present disclosure as well. Furthermore, while a specific example of cells that may store 8 values ("A"-"H" in the examples above) are provided, one of skill in the art in possession of the present disclosure will appreciate how the cells may store 2 values (e.g., "A"/"0" and "B"/"1"), 4 values (e.g., "A"/"00", "B"/"01", "C"/"10", and "D"/"11"), or more than 8 values while remaining within the scope of the present disclosure as well. Furthermore, one of skill in the art in possession of the present disclosure will appreciate how different NAND rows 332 in any particular NAND block 324 of the storage subsystem 302 may use different value encoding techniques (e.g., "A" and "B", "A"-"D", "A"-"H" in the examples above), and such mixed encoding NAND rows 332 will fall within the scope of the present disclosure.

In the illustrated embodiment, a power loss prevention system 334 is housed in the chassis 302 and coupled to the storage subsystem 320, and in specific examples may be provided by a Power Loss Prevention (PLP) capacitor and/or other power storage/provisioning subsystems that would be apparent to one of skill in the art in possession of the present disclosure. In the illustrated embodiments, the storage device processing system 304 is also coupled to an expansion bus 336 such as, for example, a Peripheral Component Interconnect express (PCIe) expansion bus that may provide the connection to the global read temperature identification engine 204, as well as to one or more storage device processing system peripherals 338. Furthermore, the expansion bus 336 may provide one or more connections for performing operations associated with the storage device 300 (e.g., connection(s) for reading/writing, connections for managing any of the data/information discussed below, etc.), and may also provide out-of-band interface(s), side channel interface(s), and/or other interfaces that provide access to the storage device processing system 304 for other systems. However, while a specific storage device 300 has been illustrated and described, one of skill in the art in possession of the present disclosure will recognize that storage devices (or other devices operating according to the teachings of the present disclosure in a manner similar to that described below for the storage device 300) may include a variety of components and/or component configurations for providing conventional storage device functionality, as well as the functionality discussed below, while remaining within the scope of the present disclosure as well.

Figure 4:
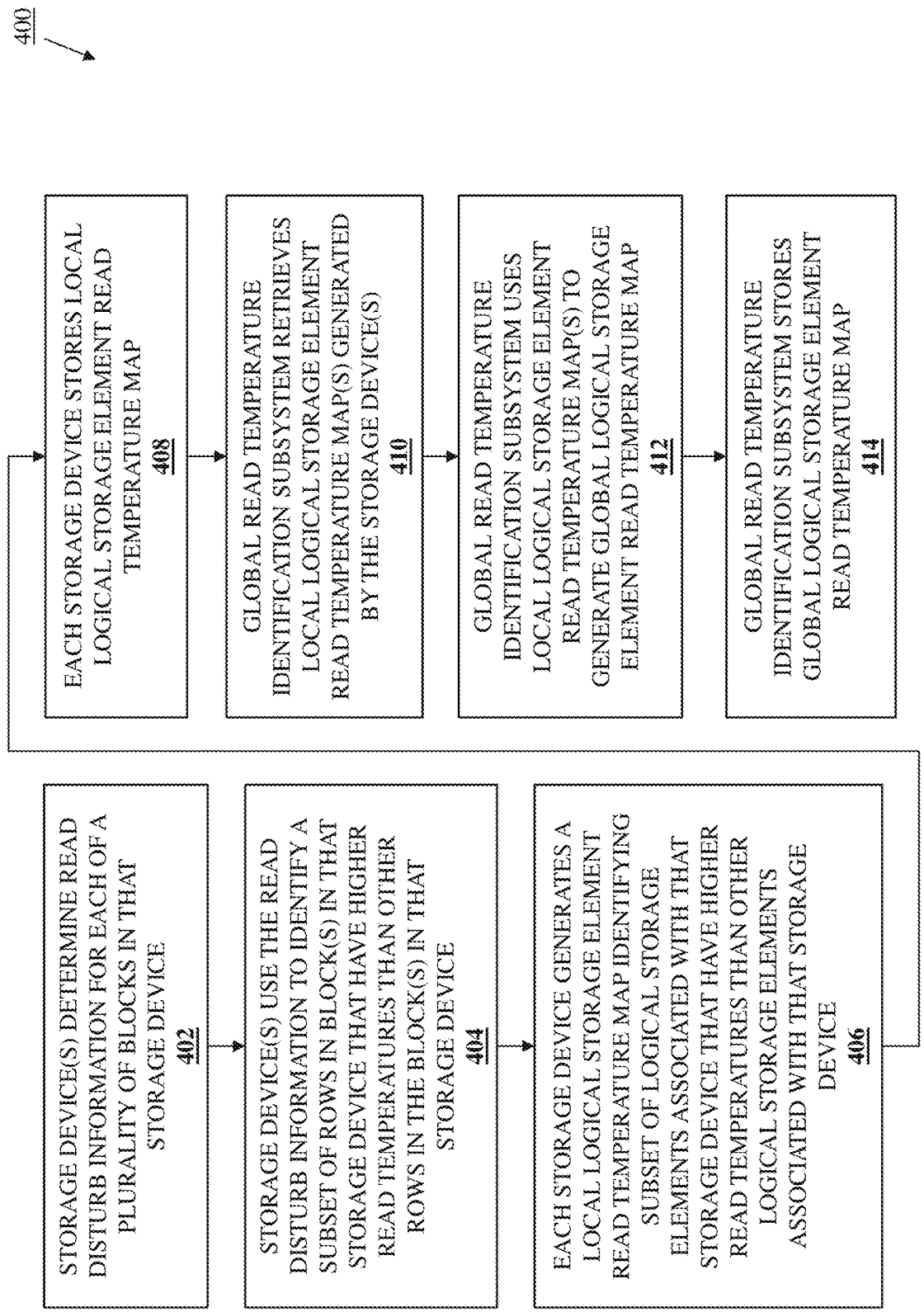
FIG. 4 is a flow chart illustrating an embodiment of a method for providing read-disturb-based read temperature identification.

Referring now to FIG. 4, an embodiment of a method 400 for providing read-disturb-based read temperature identification is illustrated. As discussed below, the systems and methods of the present disclosure utilize the read disturb effect that produces noise in adjacent NAND rows when any particular NAND row is read in order to identify NAND rows that are read more often than other NAND rows and thus have higher "read temperatures" than those other NAND rows. For example, the read-disturb-based read temperature identification system of the present disclosure may include storage device(s) that each determine read disturb information for each block in that storage device, use that read disturb information to identify a subset of rows in at least one block in that storage device that have a higher read temperature than the other rows in the at least one block in that storage device and, based on that identification, generate and store a local logical storage element read temperature map that identifies a subset of logical storage elements associated with that storage device that have a higher read temperature than the other logical storage elements associated with that storage device. A global read temperature identification subsystem coupled to the storage device(s) may then retrieve the local logical storage element read temperature map generated by each of the storage device(s) and use them to generate a global logical storage element read temperature map.

As such, the read disturb effect, which occurs automatically in response to conventional read operations and persists across power cycles, may be leveraged to generate read temperature maps for storage devices and storage systems, thus addressing many of the issues with conventional read temperature identification systems discussed above. As will be appreciated by one of skill in the art in possession of the present disclosure, the local logical storage element read temperature maps of the present disclosure are generated by the storage devices themselves (rather than the host processor/storage processor in the server device and/or storage system in which they are located), limiting read temperature identification operations performed by that host processor/storage processor to the utilization of those local logical storage element read temperature maps to generate a global logical storage element read temperature map in embodiments of the present disclosure. Furthermore, the local logical storage element read temperature maps of the present disclosure may be generated without any knowledge of the type of data being read, the application performing the read operation, or the workload being performed that resulted in the read operation.

The method 400 begins at block 402 where storage device(s) determine read disturb information for each of a plurality of blocks in that storage device. During or prior to the method 400, the computing device 200 may be utilized to write data to the storage devices 210a, 210b, and up to 210c in the storage system 208, and then read that data from those storage device(s). As will be appreciated by one of skill in the art in possession of the present disclosure, a simplified example of the writing of data to a NAND block in a storage device using the specific examples provided above includes a processing system in the computing device 200 (e.g., the processing system that provides the global read temperature identification engine 204) erasing all of the NAND rows in that NAND block to set each of their cells to the "A" value, and then selectively applying voltages across "vertical" bitlines in the NAND block and one or more "horizontal" NAND wordline(s) in NAND row(s) in that NAND block in order to cause the cells in those one or more NAND wordlines(s) to switch from the "A" value to a value indicated by a higher voltage in that cell (e.g., one of the values "B", "C", "D", "E", "F", "G", and "H" in the example above), resulting in each of those cells in the one or more NAND row(s) in that NAND block storing some number of electrons to provide one of the values "A" "B", "C", "D", "E", "F", "G", or "H" discussed above. As will be appreciated by one of skill in the art in possession of the present disclosure, the selective application of voltages discussed above may include no application of a voltage for a cell that is desired to have an "A" value.

Subsequently, data may be read from a NAND block by determining what values the cells in its NAND rows store. As will be appreciated by one of skill in the art in possession of the present disclosure, a simplified example of the reading of data from a first NAND row in a NAND block in a storage device includes a processing system in the computing device 200 (e.g., the processing system that provides the global read temperature identification engine 204) "selecting" the first NAND row by providing a voltage across the "vertical" bitlines in the NAND block, with the electrons stored in the cells in the first NAND row (i.e., to provide the values discussed above) operating to reduce the current that is sensed at the bottom of the "vertical" bitlines in the NAND block and that is produced in response to the applied voltage (with the sensing of that reduced current operating to identify particular values in the cells in the first NAND row). However, in order to prevent other second NAND rows in that NAND block that are not being read from effecting the current resulting from the voltage provided across the "vertical" bitlines in that NAND block (i.e., in order to ensure the effect on that current by the electrons stored in the cells of the first NAND row may be sensed as discussed above), those second NAND rows are "deselected" by providing a "bypass" voltage across each of those "horizontal" second NAND rows that forces its cell(s) to conduct current on the bitline.

As will be appreciated by one of skill in the art in possession of the present disclosure, the provisioning of that "bypass" voltage across each of the "horizontal" second NAND rows results in the "micro-programming" of those second NAND rows caused by electrons accumulating in those second NAND rows each time the first NAND row is read (i.e., due to the "bypass" voltage used to "deselect" them attracting electrons out of the bitline), which is referred to as the "read disturb effect" herein. Furthermore, one of skill in the art in possession of the present disclosure will appreciate how the read disturb effect/microprogramming/electron accumulation discussed above is higher in second NAND rows that are closer to the first NAND row being read, and the amount of read disturb effect/microprogramming/electron accumulation in NAND rows will depend on the type of SSD technology used in the SSD storage device.

As will be appreciated by one of skill in the art in possession of the present disclosure, while each NAND row includes many cells that may each identify multiple different values, any read of a NAND row operates to read all the cells in that NAND row and, as such, it is the read temperature of the NAND row that is of concern. Furthermore, while it is possible to read a portion of a NAND row (some subset of the NAND wordlines in that NAND row), that read operation will still apply a voltage to that entire NAND row in order to accomplish the read, thus introducing the same read disturb effect in that NAND row that would have occurred if the entire NAND row had been read.

Conventionally, the read disturb effect discussed above is considered a problem that must be corrected, as the micro-programming/electron accumulation in second NAND row(s) adjacent a first NAND row that is read often can cause a desired value in one or more of the cells in those second NAND row(s) to be mistakenly read as a different value, which one of skill in the art in possession of the present disclosure will appreciate results in a number of incorrect or "flipped" bits (i.e., bits that do not match their originally written value) that provide a "fail bit count" and must be corrected (e.g., using the error check portion 326b associated with the data portion 326a provided by the cell in the NAND wordline) to reverse the change in the value read for that cell in that NAND row. However, as discussed in further detail above, the inventors of the present disclosure have discovered that the read disturb effect may be leveraged in order to identify the read temperature of NAND rows in NAND blocks in a manner that eliminates many of the issues present in conventional read temperature identification systems.

As such, subsequent to the writing of data to the storage device(s) 210a-210c and the reading of that data from those storage device(s) 210a-210c, any or all of those storage device(s) 210a-210c/300 may operate at block 402 to determine read disturb information for each of the NAND blocks 324 included in the NAND die 322 in the storage subsystem 320 in that storage device. As will be appreciated by one of skill in the art in possession of the present disclosure, the discussion below of the determination of read disturb information by the storage device 300 may apply to any of the storage devices 210a-210c, and may be performed upon startup, reset, or other initialization of the storage device 300, periodically by the storage device during runtime, at the request of a user of the computing device 200, and/or on any other schedule or at any other time that would be apparent to one of skill in the art in possession of the present disclosure.

Figure 5A:
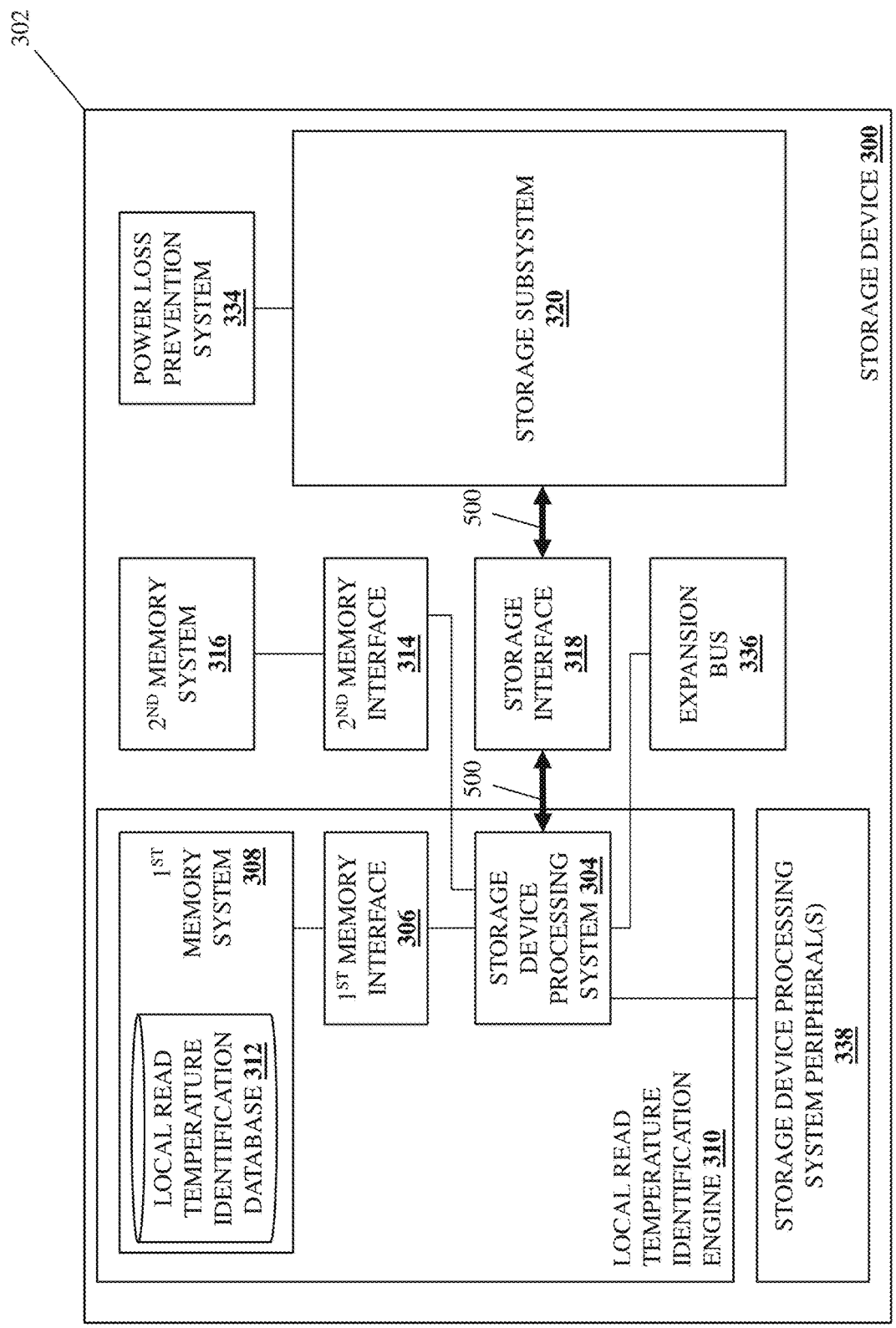
FIG. 5A is a schematic view illustrating an embodiment of the storage device of FIG. 3A operating during the method of FIG. 4.

With reference to FIG. 5A, in an embodiment of block 402, the storage device processing system 304 in the storage device 300 may perform read disturb information retrieval operations 506 that may include the storage device processing system 304 retrieving, via the storage interface 318, read disturb information associated with each of the NAND blocks 324 included in the NAND die 322 in the storage subsystem 320. The inventors of the present disclosure have developed techniques for retrieving read disturb information that are described in U.S. patent application Ser. No. 17/578, 694, filed Jan. 19, 2022, the disclosure of which is incorporated by reference herein in its entirety. However, while the retrieval of read disturb information from each of the NAND rows 332 in each of the NAND blocks 324 in the storage subsystem 320 is described, one of skill in the art in possession of the present disclosure will appreciate how the retrieval of read disturb information for a subset of NAND rows 332 in a subset of NAND blocks 324 in the storage subsystem 320 will fall within the scope of the present disclosure as well (e.g., when a previously "hot" subset of NAND rows in NAND block(s) are being checked to determine whether they are still "hot").

Figure 5B:
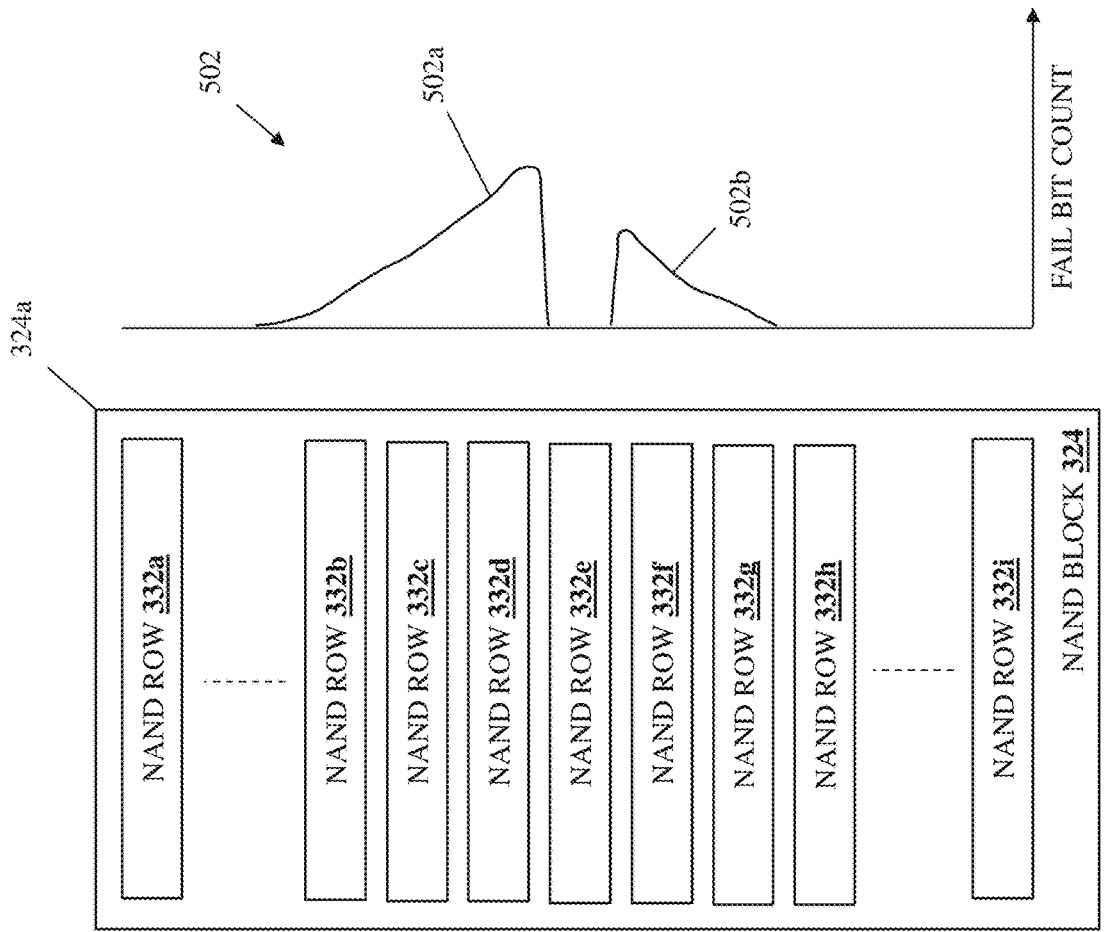
FIG. 5B is a schematic view illustrating an embodiment of a read disturb signature identified for the NAND rows in the NAND block of FIG. 3E during the method of FIG. 4.

For example, the read disturb information retrieval operations 506 performed at block 402 may include the storage device processing system 304 in the storage device 300 accessing each NAND block 324 to identify a read disturb "signature" for each of a plurality of NAND rows 332a-332i in that NAND block 324 that may be provided by fail bit counts in one or more adjacent NAND rows. With reference to FIG. 5B, a specific example of the read disturb information for the NAND row 332e in a NAND block 324 is provided, and illustrates a read disturb signature 502 provided by fail bit counts for some of the NAND rows 332a-332d and 332f-332i.

In particular, the read disturb signature 502 illustrated in FIG. 5B includes a fail bit count portion 502a associated with the NAND rows 332a-332e on a "first side" of the NAND row 332e, and a fail bit count portion 502b associated with the NAND rows 332f-332i on a "second side" of the NAND row 332e. As will be appreciated by one of skill in the art in possession of the present disclosure, the distribution of the read disturb signature 502 provides a histogram across all the cells in NAND wordlines of the NAND rows (e.g., with some cells in the NAND wordline(s) in the NAND row 332f relatively more effected by the read disturb effect than other cells in that NAND wordlines in that NAND row 332f), with all of the NAND wordlines in the NAND rows impacted by the read disturb effect to some extent (i.e., due to electron accumulation prior to the attenuation effects discussed above). However, while a particular example is provided, one of skill in the art in possession of the present disclosure will appreciate that other storage subsystem technologies (e.g., SCM storage devices, Dual Data Rate (DDR) storage devices, etc.) provide similar effects (e.g., DDR storage devices experience a "row hammer" effect) that will fall within the scope of the present disclosure as well. As will be appreciated by one of skill in the art in possession of the present disclosure, the fail bit count portion 502a illustrates how the NAND row 332d experiences a higher fail bit count than the NAND row 332c, which experiences a higher fail bit count than the NAND row 332b, and so on due to their relative proximity to the NAND row 332e. Similarly, the fail bit count portion 502b illustrates how the NAND row 332f experiences a higher fail bit count than the NAND row 332g, which experiences a higher fail bit count than the NAND row 332h, and so on due to their relative proximity to the NAND row 332e.

Furthermore, the fail bit count portions 502a and 502b also illustrate how the NAND row 332d experiences a higher fail bit count than the NAND row 332f due to the NAND row 332d seeing the "full" current resulting from the voltage applied to the "vertical" bitlines in the NAND block when performing a read of the NAND row 332e relative to the current that is attenuated by the charge in the cell of the NAND row 332e (e.g., if the charge in the cell(s) of a NAND row provides a relatively low voltage value (e.g., the "A" value discussed below), the "downstream" NAND rows will see relatively more electrons than the "upstream" NAND rows, while if the charge in the cell(s) of a NAND row provides a relatively high voltage value (e.g., the "H" value discussed below), the "downstream" NAND rows will see relatively less electrons than the "upstream" NAND rows).

Figure 5C:
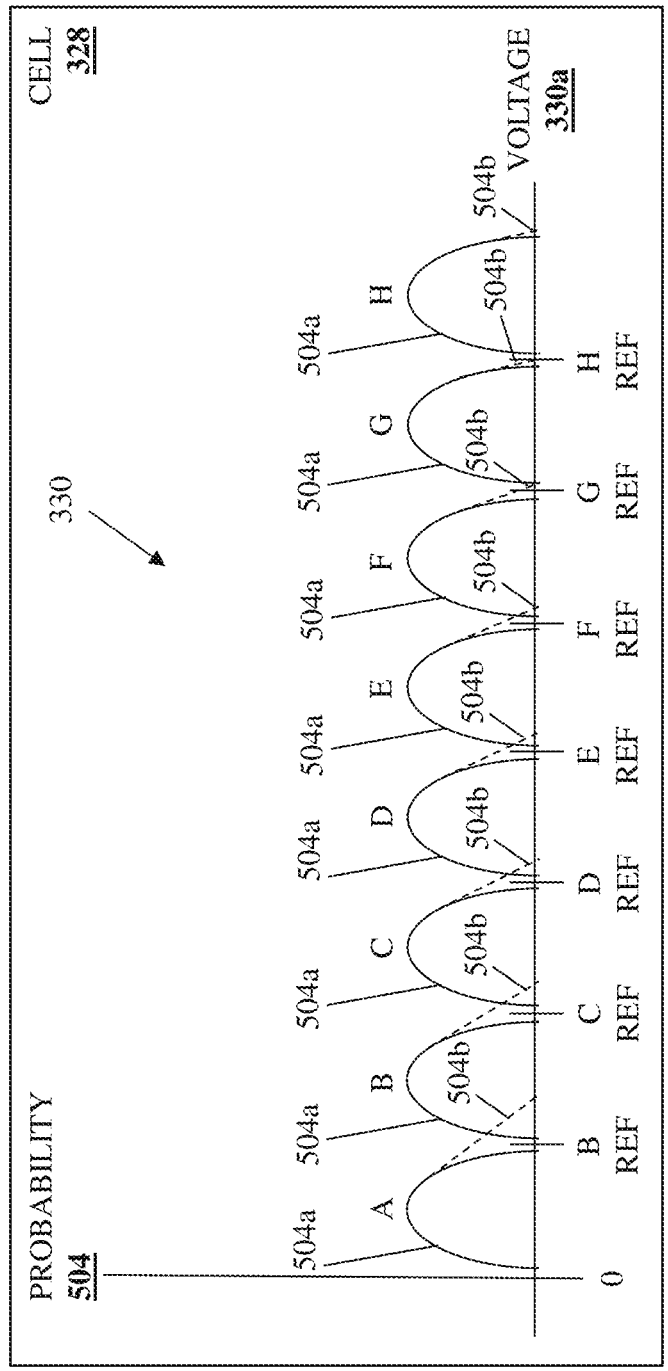
FIG. 5C is a graph view illustrating an embodiment of voltage skewing in a cell that provides a portion of the read disturb signature of FIG. 5B during the method of FIG. 4.

With reference to FIG. 5C, the simplified representation from FIG. 3D of how data may be stored in a cell 328 is reproduced, but with the data storage representation of the cell 328 in FIG. 5C including the graph 330 with voltage 330a on the X-axis and probability 504 on the Y-axis. The graph 330 in FIG. 5C also includes voltage/value probabilities 504a (provided in solid lines) for each value "A"-"H" available in the cell 328 that, as can be seen, is highest in the middle of the voltage range for each value "A"-"H", and reduces to near-zero near the bounds of the voltage range for each value "A"-"H" (e.g., the voltage/value probability for the value "A" is highest midway between "0" and "B REF" and reduces to near-zero at both "0" and "B REF", the voltage/value probability for the value "B" is highest midway between "B REF" and "C REF" and reduces to near-zero at both "B REF" and "C REF", and so on).

As will be appreciated by one of skill in the art in possession of the present disclosure, the cell 328 associated with the graph 330 in FIG. 5C has experienced the read disturb effect (e.g., it is a cell in one of the NAND rows 332b-d, 332f, or 332g in FIG. 5B), and the graph 330 illustrates a read disturb effect skew 504b (provided in dashed lines) that illustrates how the read disturb effect skews the voltage/value probabilities 504a for each value "A"-"H" available in the cell 328. As discussed above, after a plurality of reads to an adjacent NAND row (e.g., the NAND row 332e) that causes the accumulation of charge in a particular NAND row (e.g., the NAND row 332d), a desired value in some cells may be mistakenly read as a different value due to the voltage in those cells crossing the reference voltage that defines that different value.

For example, FIG. 5C illustrates how the accumulation of charge in the NAND row 332d may introduce the read disturb effect skew 504b for one or more of the values "A"-"H" that can cause at least a portion of the voltage/value probabilities 504a for those values to shift across the reference voltage for an adjacent value. As can be seen in FIG. 5C, the read disturb effect skew 504b to the voltage/value probability 504a for the value "A" causes that voltage/value probability 504a to skew past the B REF, and thus some reads of voltages in the cell 328 that are desired to provide the value "A" will instead mistakenly provide the value "B" (i.e., due to the actual voltage read being between the B REF and the C REF because it was "pushed" in that "direction" due to the read disturb effect). Furthermore, while a single example is provided, one of skill in the art in possession of the present disclosure will appreciate how the read disturb effect skew 504b to the voltage/value probability 504a for any of the values "B"-"H" can result in the identification of a mistaken value in a similarly manner.

One of skill in the art in possession of the present disclosure will recognize how conventional systems (e.g., SSD storage device firmware and controllers) may utilize software to shift the reference voltages for one or more values in a cell to compensate for this read disturb effect. However, at block 402, the storage device processing system 304 may instead identify this read disturb information for each NAND row in each of a plurality of NAND blocks 324 in its storage device 300, and one of skill in the art in possession of the present disclosure will appreciate how the read disturb signature for each of those NAND rows will differ depending on whether that NAND row has been read a relatively higher number of times (in which case its read disturb signature will include relatively high fail bit counts for its adjacent NAND rows), whether that NAND row has been read a relatively lower number of times (in which case its read disturb signature will include relatively lower fail bit counts for its adjacent NAND rows), whether that NAND row has been read a relatively intermediate number of times (in which case its read disturb signature will include relatively intermediate fail bit counts for its adjacent NAND rows), etc.

Techniques for using fail bit counts that provide read disturb signatures in order to determine read disturb information are described by the inventors of the present disclosure in more detail in U.S. patent application Ser. No. 17/581,882, filed Jan. 22, 2022; and U.S. patent application Ser. No. 17/581,896, filed Jan. 22, 2022; the disclosures of which are incorporated by reference herein in their entirety. However, one of skill in the art in possession of the present disclosure will appreciate that other techniques may be utilized to determine read disturb information while remaining within the scope of the present disclosure. For example, the inventors of the present disclosure have developed techniques for determining read disturb information without the need to explicitly identify failed bit counts, which are described in U.S. patent application Ser. No. 17/581,879, filed Jan. 22, 2022, the disclosure of which is incorporated by reference herein in its entirety.

Figure 5D:
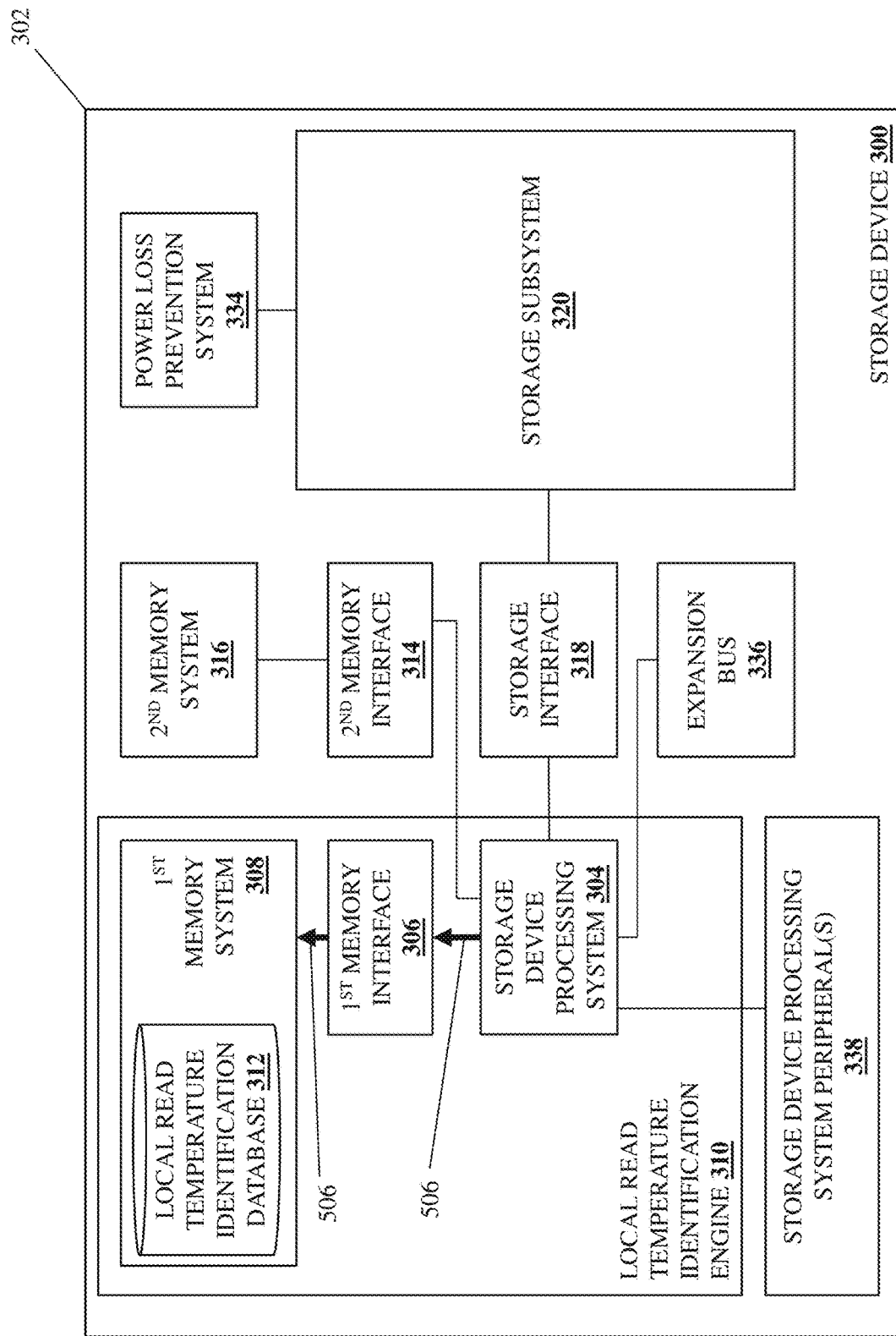
FIG. 5D is a schematic view illustrating an embodiment of the storage device of FIG. 3A operating during the method of FIG. 4.

With reference to FIG. 5D, the storage device processing system 304 may then perform read disturb information storage operations 506 that include accessing the first memory system 308 vis the first memory interface 306 and storing the read disturb information in the local read temperature identification database 312. As such, following block 402, each of the storage devices 210a-210c/300 in the computing device 200 may have determined and stored read disturb information for each NAND row 332a-332i included in each of its NAND blocks 324 provided by each of its NAND dies 322 in its storage subsystem 320.

In some embodiments, at block 402 and prior to or subsequent to storing the read disturb information in the local read temperature identification database 312, the storage device processing system 304 in the storage device 300 may perform read disturb information isolation operations in order to isolate data in the read disturb information determined for each NAND row 332a-332i included in each of its NAND blocks 324 provided by each of its NAND dies 322 in its storage subsystem 320. The inventors of the present disclosure have developed several techniques for isolating read disturb information that are described in U.S. patent application Ser. No. 17/578,694, filed Jan. 19, 2022, the disclosure of which is incorporated by reference herein in its entirety. As described in those patent documents, the read disturb information determined at block 402 by the storage device processing system 304 for each NAND row 332a-332i included in each of its NAND blocks 324 provided by each of its NAND dies 322 in its storage subsystem 320 may include "noise" and/or other information artifacts that are not indicative of the read disturb effect, and thus different isolation techniques may be performed on the read disturb information in order to allow the storage device processing system 304 to more accurately characterized the read disturb effect for each NAND row 332a-332i included in each of its NAND blocks 324 provided by each of its NAND dies 322 in its storage subsystem 320. As such, in some embodiments, the read disturb information stored in the local read temperature identification database 312 in each storage device 210a-210c/300 may be isolated read disturb information.

Figure 6:
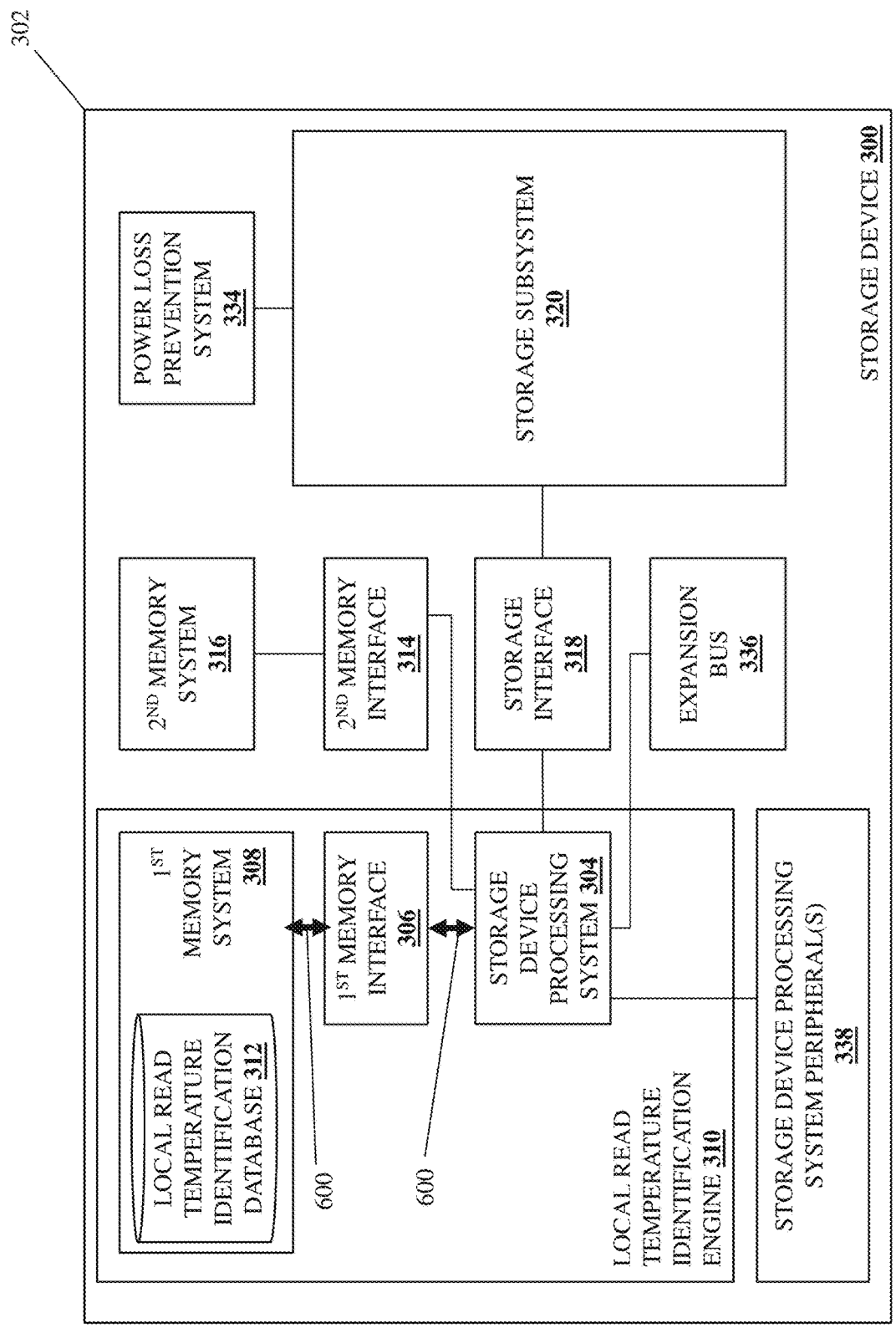
FIG. 6 is a schematic view illustrating an embodiment of the storage device of FIG. 3A operating during the method of FIG. 4.

The method 400 then proceeds to block 404 where the storage device(s) use the read disturb information to identify a subset of rows in block(s) in that storage device that have higher read temperatures than other rows in the block(s) in that storage device. With reference to FIG. 6, in an embodiment of block 404, the storage device processing system 304 may perform read temperature identification operations 600 that may include accessing the read disturb information stored in the local read temperature identification database 312 (e.g., via the first memory interface 306 and the first memory system 308), and identifying relative read temperatures of each NAND row 332a-332i included in each of its NAND blocks 324 provided by each of its NAND dies 322 in its storage subsystem 320. However, while the read temperature information is described as being stored in the local read temperature identification database 312 prior to being accessed and used to identify relative read temperatures of NAND rows, one of skill in the art in possession of the present disclosure will recognize that the read temperature information may be used to identify relative read temperatures of NAND rows upon its collection and without storing it in the local read temperature identification database 312 (e.g., relative read temperatures of NAND rows may be identified "on the fly" as read disturb information is collected at block 402) while remaining within the scope of the present disclosure as well.

As discussed above, the read disturb signature determined for each NAND row will differ depending on whether that NAND row has been read a relatively higher number of times, whether that NAND row has been read a relatively lower number of times, whether that NAND row has been read a relatively intermediate number of times, etc. Furthermore, one of skill in the art in possession of the present disclosure will appreciate how NAND rows that have been read a relatively higher number of times may be identified as having a relatively high read temperature, NAND rows that have been read a relatively lower number of times have be identified as having a relatively low read temperature, NAND rows that have been read a relatively intermediate number of times may be identified as having a relatively intermediate temperature, and so on.

As such, in some embodiments of block 404, the storage device processing system 304 may analyze each read disturb signature determined for each NAND row 328a-328i included in each of its NAND blocks 324 provided by each of its NAND dies 322 in its storage subsystem 320, and determine whether that read disturb signature identifies a relatively high read temperature (e.g., because the NAND rows adjacent the NAND row for which that read disturb signature was generated experienced relatively high fail bit counts), whether that read disturb signature identifies a relatively low read temperature (e.g., because the NAND rows adjacent the NAND row for which that read disturb signature was generated experienced relatively low fail bit counts), whether that read disturb signature identifies a relatively intermediate read temperature (e.g., because the NAND rows adjacent the NAND row for which that read disturb signature was generated experiences relatively intermediate fail bit counts), and/or whether that read disturb signature identifies other read temperature granularities that are distinguishable from the relatively high read temperature, the relatively low read temperature, and the relatively intermediate read temperature discussed above.

Furthermore, in some embodiments of block 404, the storage device 300 may operate to process current and previously determined read disturb information for a NAND row in order to generate a read temperature for that NAND row, and the inventors of the present disclosure describe techniques for storage devices to generate read temperature in U.S. patent application Ser. No. 17/580,359, filed Jan. 20, 2022; U.S. patent application Ser. No. 17/580,756, filed Jan. 21, 2022; and U.S. patent application Ser. No. 17/580,888, filed Jan. 21, 2022; the disclosures of which are incorporated by reference herein in their entirety.

As will be appreciated by one of skill in the art in possession of the present disclosure, any relative read temperature metrics may be assigned to the relatively high read temperature, relatively low read temperature, relatively intermediate read temperature, and so on, in order to indicate the different read temperatures for each of the NAND rows. For example, the NAND row read temperatures identified as discussed above using NAND row read disturb signatures may not provide exact numerical read temperatures (e.g., as may be provided in conventional read temperature identification systems may operate to record the exact number of reads of a NAND row), but the inventors of the present disclosure have found that the use of the NAND row read disturb signatures to provide NAND row read temperatures as discussed above provide for the accurate identification of relative temperatures of the different NAND rows in a storage subsystem. Furthermore, as read disturb signature analysis becomes more accurate in the future, the inventors of the present disclosure expect that any particular read disturb signature may then be associated with a number of reads of a NAND row, and thus envision doing so while remaining within the scope of the present disclosure as well.

While the embodiments discussed below describe the use of the read temperature determined as described above to generate a local logical storage element read temperature map, the inventors of the present disclosure have developed techniques for storage devices to identify and use read temperatures based on the read disturb effect to move data without the need to generate a local logical storage element read temperature map that are described in U.S. patent application Ser. No. 17/579,654, filed Jan. 20, 2022, the disclosure of which is incorporated by reference herein in its entirety.

The method 400 then proceeds to block 406 where each of the storage device(s) generate a local logical storage element read temperature map identifying a subset of logical storage elements that are associated with that storage device and that have higher read temperatures than other logical storage elements associated with that storage device, as well as to block 408 where the storage device(s) store the local storage element read temperature map generated by that storage device. The inventors of the present disclosure have developed several techniques for generating and/or maintaining a local logical storage element read temperature map that are described in U.S. patent application Ser. No. 17/581,874, filed Jan. 22, 2022; U.S. patent application Ser. No. 17/581,785, filed Jan. 21, 2022; U.S. patent application Ser. No. 17/581,677, filed Jan. 21, 2022; U.S. patent application Ser. No. 17/579,988, filed Jan. 20, 2022; the disclosures of which are incorporated by reference herein in their entirety. As described in those patent documents, local logical storage element read temperature maps may be generated by mapping read temperatures identified for physical storage to a logical-to-physical mapping (e.g., via a "reverse lookup"), and may be maintained by identifying any historical read temperature(s) associated with a logical storage element when its data is moved to a new storage element (i.e., by writing that data to a physical storage location mapped to that new storage element), and then mapping those historical read temperatures to that new storage element in the logical-to-physical mapping as well (and in some cases, persistently storing those historical read temperatures in the NAND block that stores the corresponding data, in a metadata NAND block in the storage subsystem 320, and/or in other storage locations that would be apparent to one of skill in the art in possession of the present disclosure).

In an embodiment, at block 406, the storage device processing system 304 in the storage device 300 may generate a local logical storage element read temperature map using the relative read temperatures identified for each NAND row 332a-332i included in each of its NAND blocks 324 provided by each of its NAND dies 322 in its storage subsystem 320 at block 404. In an embodiment, the storage device 300 may utilize Logical Block Addressing (LBA), which one of skill in the art in possession of the present disclosure will recognize logically divides the storage subsystem 320 into logical storage elements (e.g., 512 byte to 4096 byte sectors), with the first logical storage element identified as logical block 0, the second logical storage element identified as logical block 1, and so on, and with each logical storage element mapped to a respective NAND row 332a-332i included in the NAND blocks 324 provided by the NAND dies 322 in the storage subsystem 320.

As such, block 406 may include the storage device processing system 304 mapping, in a local logical storage element read temperature map, the read temperature determined for each NAND row at block 404 to the logical storage element that is mapped to that NAND row. Thus, continuing with the example provided above, a read temperature identified for a first NAND row may be mapped, in the local logical storage element read temperature map, to an LBA block 0 that is mapped to the first NAND row; a read temperature identified for a second NAND row may be mapped, in the local logical storage element read temperature map, to an LBA block 1 that is mapped to the second NAND row; a read temperature identified for a third NAND row may be mapped, in the local logical storage element read temperature map, to an LBA block 2 that is mapped to the third NAND row; and so on until a read temperature is mapped to each of the LBA blocks.

In a specific example, any NAND row may be mapped to one or more logical storage elements, and in the event a NAND row has a particular read temperature, each logical storage element mapped to that NAND row will have that particular read temperature. As such, the present disclosure may provide read temperature granularity at the NAND row level. Furthermore, while most storage device implementations today map logical blocks to NAND rows such that each logical block is fully contained within that NAND row, one of skill in the art in possession of the present disclosure will appreciate that a logical block may "straddle" multiple NAND rows, and in such cases read temperatures of that logical block may be computed by combining the read temperatures determined for those multiple NAND rows using any of variety of techniques that would be apparent to one of skill in the art in possession of the present disclosure. Thus, following block 406, each of the storage devices 210a-210c/300 may have generated a respective local logical storage element read temperature map, and at block 408 each of the storage devices 210a-210c/300 may have stored that local logical storage element read temperature map in its local read temperature identification database 312.

Figure 7A:
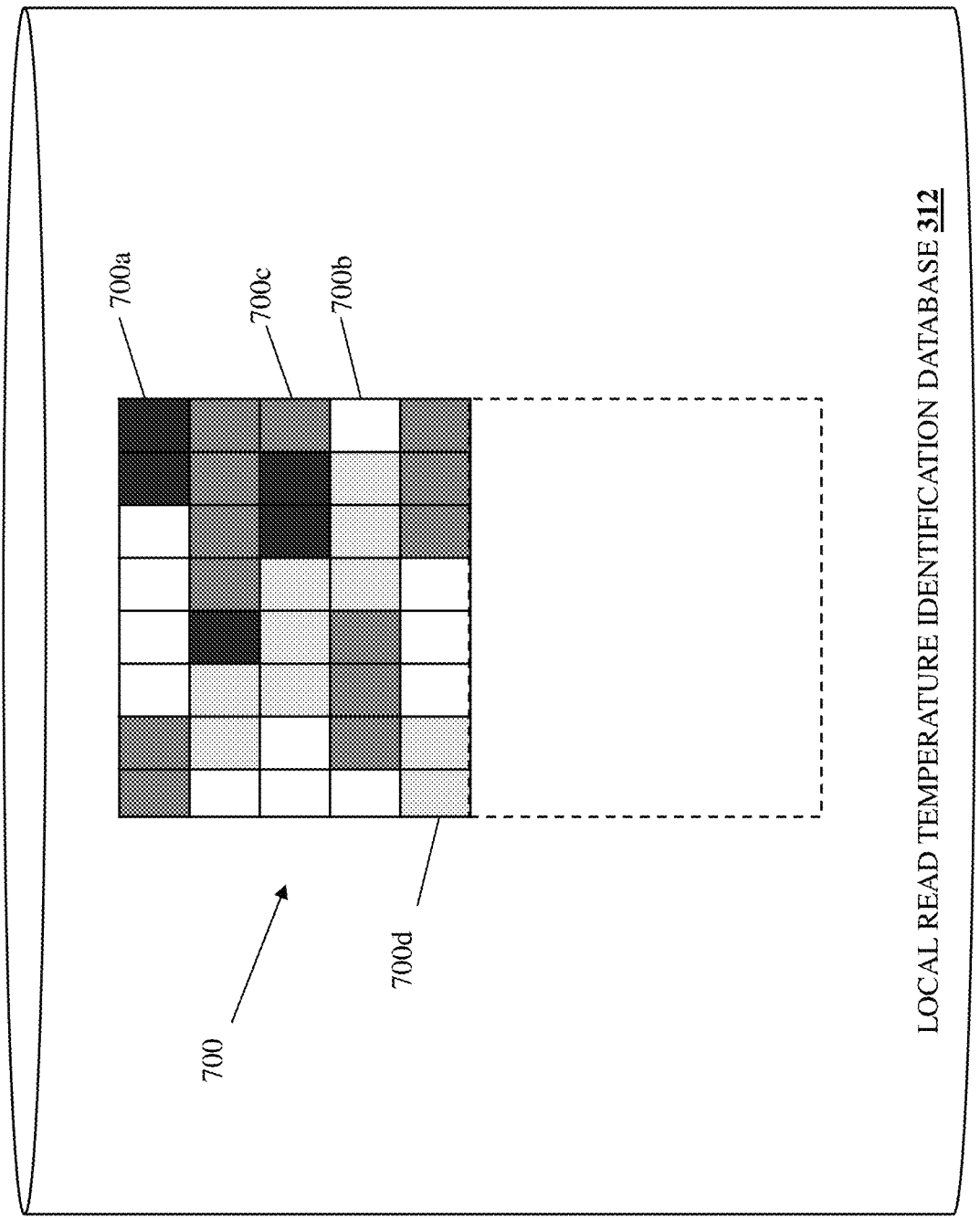
FIG. 7A is a schematic view illustrating an embodiment of local logical storage element read temperature map generated by a first storage device in the computing device of FIG. 2 during the method of FIG. 4.

With reference to FIG. 7A, an example of a local logical storage element read temperature map 700 is illustrated that may have been generated and stored by a first of the storage devices 210a-210c/300 in its local read temperature identification database 312. In the illustrated example, the local logical storage element read temperature map 700 includes relatively high read temperature logical storage elements 700a (illustrated as black boxes in the local logical storage element read temperature map 700), relatively low read temperature logical storage elements 700b (illustrated as white boxes in the local logical storage element read temperature map 700), relatively high-intermediate read temperature logical storage elements 700c (illustrated as dark grey boxes in the local logical storage element read temperature map 700), and relatively low-intermediate read temperature logical storage elements 700d (illustrated as light grey boxes in the local logical storage element read temperature map 700). However, one of skill in the art in possession of the present disclosure will recognize that the inclusion of other levels of read temperature granularity in local logical storage element read temperature maps will fall within the scope of the present disclosure as well. As will be appreciated by one of skill in the art in possession of the present disclosure, the dashed line in FIG. 7A is provided to indicate that the local logical storage element read temperature map 700 is one of a plurality of local logical storage element read temperature maps that provide the total logical storage space for the computing device 200.

Figure 7B:
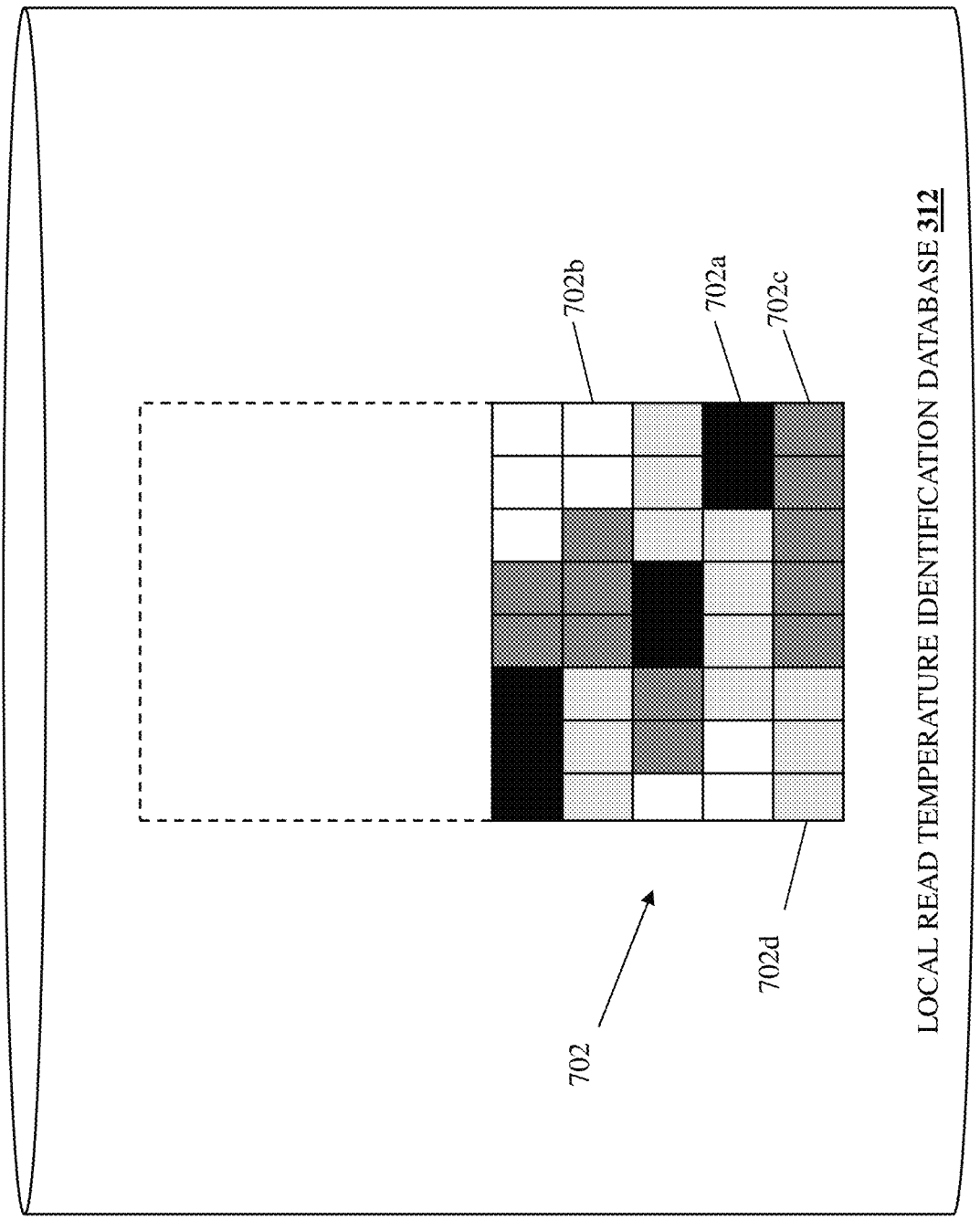
FIG. 7B is a schematic view illustrating an embodiment of local logical storage element read temperature map generated by a second storage device in the computing device of FIG. 2 during the method of FIG. 4.

With reference to FIG. 7B, an example of a local logical storage element read temperature map 702 is illustrated that may have been generated and stored by a second of the storage devices 210a-210c/300 in its local read temperature identification database 312. In the illustrated example, the local logical storage element read temperature map 702 includes relatively high read temperature logical storage elements 702a (illustrated as black boxes in the local logical storage element read temperature map 702), relatively low read temperature logical storage elements 702b (illustrated as white boxes in the local logical storage element read temperature map 702), relatively high-intermediate read temperature logical storage elements 702c (illustrated as dark grey boxes in the local logical storage element read temperature map 70), and relatively low-intermediate read temperature logical storage elements 702d (illustrated as light grey boxes in the local logical storage element read temperature map 702). However, one of skill in the art in possession of the present disclosure will recognize that the inclusion of other levels of read temperature granularity in local logical storage element read temperature maps will fall within the scope of the present disclosure as well. As will be appreciated by one of skill in the art in possession of the present disclosure, the dashed line in FIG. 7B is provided to indicate that the local logical storage element read temperature map 702 is one of a plurality of local logical storage element read temperature maps that provide the total logical storage space for the computing device 200. Furthermore, while examples of only two local logical storage element read temperature maps 700 and 702 generated by two storage devices are provided, one of skill in the art in possession of the present disclosure will appreciate that storage systems may include many more storage devices, and each of those storage devices may generate a local logical storage element read temperature map while remaining within the scope of the present disclosure as well.

While the embodiments discussed below describe the use of local logical storage element read temperature maps from different storage devices to generate a global logical storage element read temperature map, the inventors of the present disclosure have developed techniques for storage devices to use their local logical storage element read temperature map to move data that are described in U.S. patent application Ser. No. 17/579,689, filed Jan. 20, 2022, the disclosure of which is incorporated by reference herein in its entirety. Furthermore, the global read temperature identification engine 204 (or other host subsystem in the computing device 200) may operate to adjust read temperatures included in the local logical storage element read temperature map based on data characteristics of the data stored in corresponding logical storage elements, and the inventors of the present disclosure describe techniques for host subsystem read temperature adjustments in U.S. patent application Ser. No. 17/580,756, filed Jan. 21, 2022; and U.S. patent application Ser. No. 17/580,888, filed Jan. 21, 2022; the disclosures of which are incorporated by reference herein in their entirety.

Figure 8A:
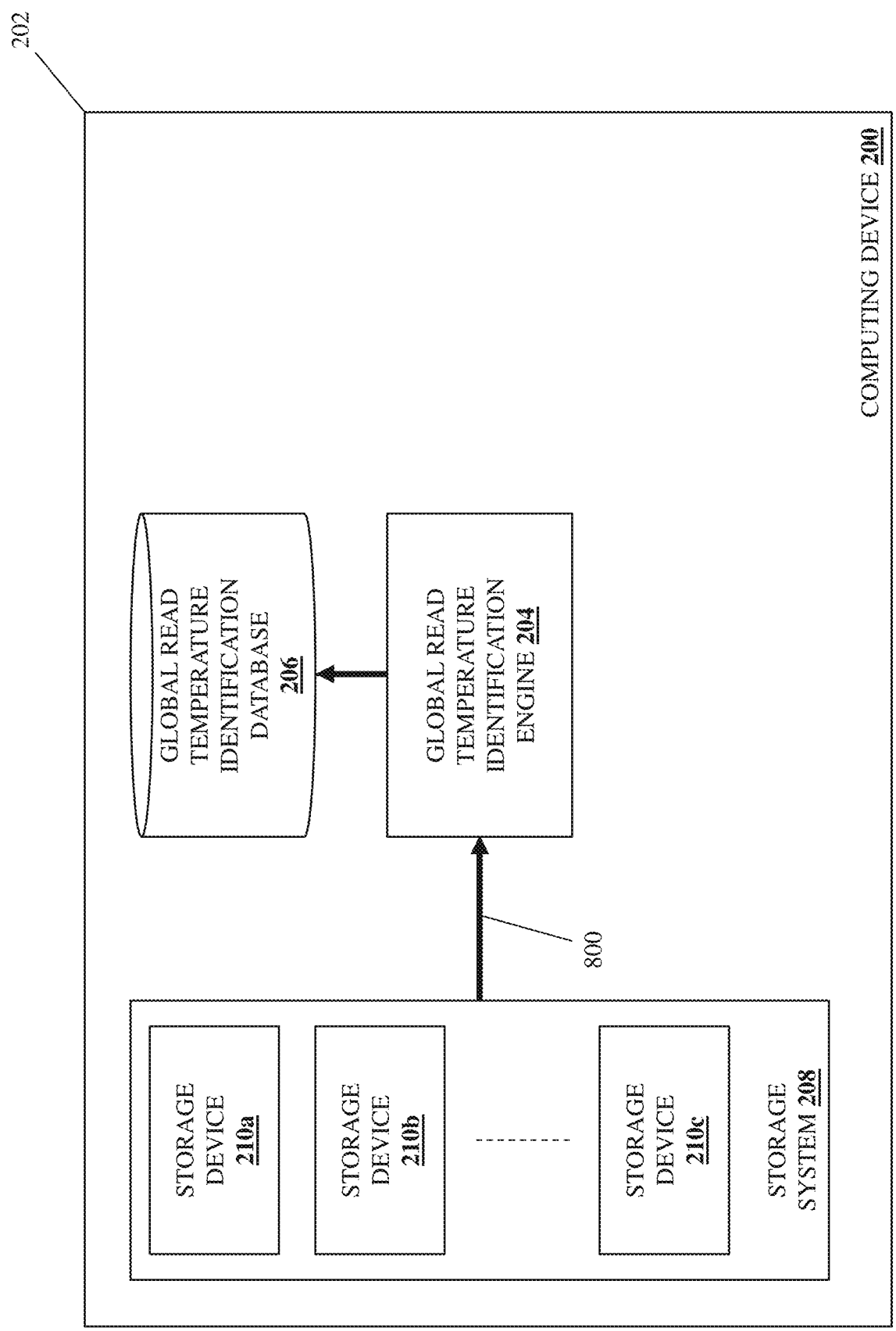
FIG. 8A is a schematic view illustrating an embodiment of the computing device of FIG. 2 operating during the method of FIG. 4.

The method 400 then proceeds to block 410 where a global read temperature identification subsystem retrieves the local logical storage element read temperature map(s) generated by the storage device(s). With reference to FIG. 8A, in an embodiment of block 410, the global read temperature identification engine 204 in the computing device 200 may perform local logical storage element read temperature map retrieval operations 800 in order to retrieve the local logical storage element read temperature maps generated and stored by the storage devices 210a, 210b, and up to 210c at blocks 406 and 408. As discussed below, the local logical storage element read temperature maps, information provided therein, and/or associated information may be accessed and retrieved by the global read temperature identification engine 204 (or a read-disturb-based read temperature information management engine) in the computing device 200 using a read-disturb-based read temperature information Application Programming Interface (API) provided for the storage devices 210a-210c, and the inventors of the present disclosure describe other techniques for retrieving local logical storage element read temperature maps, information provided therein, and/or associated information in U.S. patent application Ser. No. 17/579,020, filed Jan. 19, 2022, the disclosure of which is incorporated by reference herein in its entirety. Furthermore, as discussed in further detail below and as will be appreciated by one of skill in the art in possession of the present disclosure, the read-disturb-based read temperature information Application Programming Interface (API) provided for the storage devices 210a-210c may be utilized by the global read temperature identification engine 204 (or a read-disturb-based read temperature information management engine) in the computing device 200 to issue any of the read-disturb-based read temperature information commands described below to the storage devices 210a-210c prior to, during, or following the method 400.

As will be appreciated by one of skill in the art in possession of the present disclosure, in some examples the global read temperature identification engine 204 in the computing device 200 may access the local read temperature identification databases 312 in the first memory system 308 in each of the storage devices 210a-210c/300 in order to retrieve the local logical storage element read temperature maps stored therein, while in other embodiments the global read temperature identification engine 204 in the computing device 200 may provide requests for those local logical storage element read temperature maps such that each of the storage devices 210a-210c/300 transmit them to the global read temperature identification engine 204.

Figure 8B:
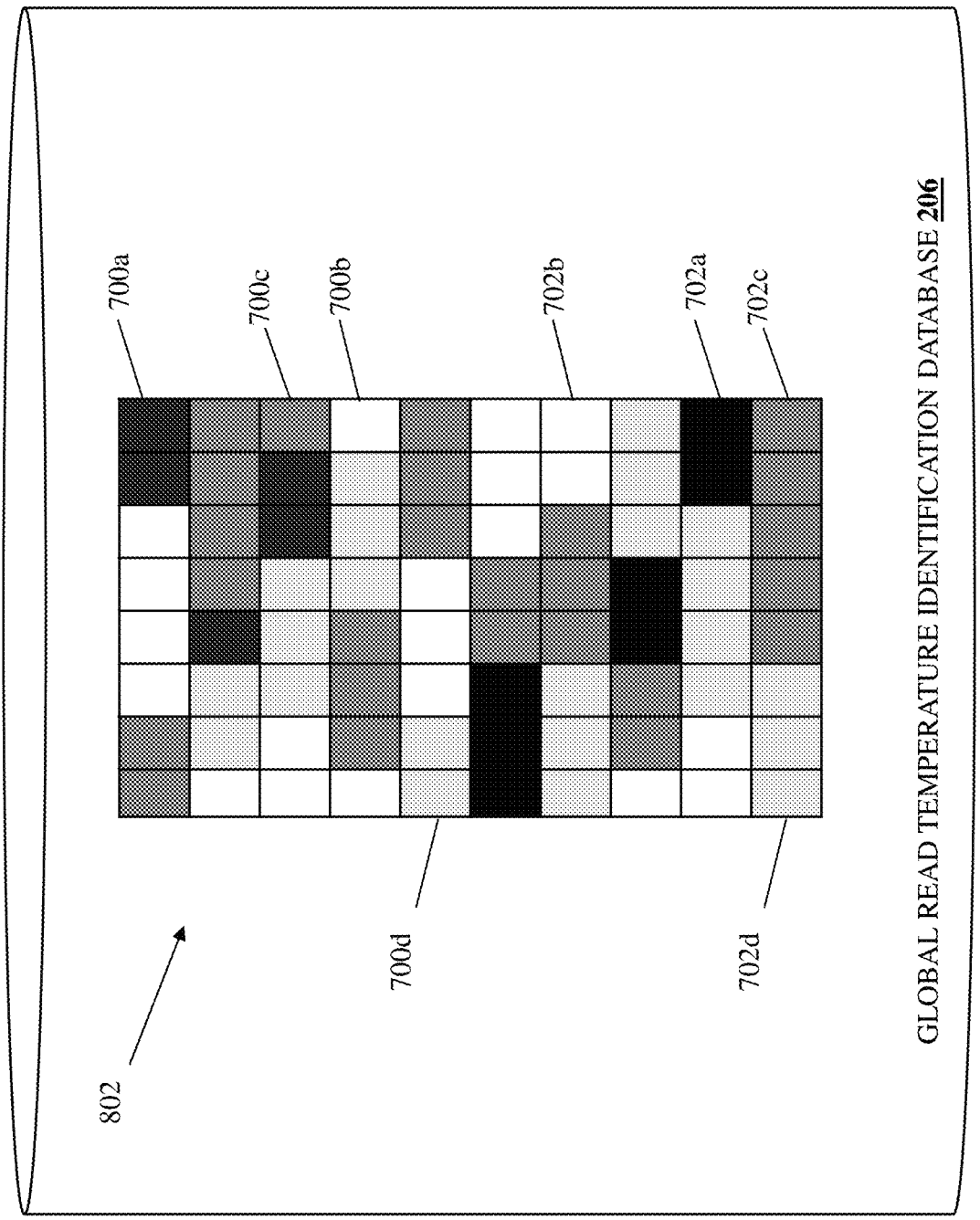
FIG. 8B is a schematic view illustrating an embodiment of global logical storage element read temperature map generated by the computing device of FIG. 2 during the method of FIG. 4.

The method 400 then proceeds to block 412 where the global read temperature identification subsystem uses the local logical storage element read temperature map(s) to generate a global logical storage element read temperature map, as well as to optional block 414 where the global read temperature identification subsystem stores the global logical storage element read temperature map. In some embodiment, at block 412, the global read temperature identification engine 204 in the computing device 200 may concatenate the local logical storage element read temperature maps retrieved from the storage devices 210a-210c/300 to generate a global logical storage element read temperature map that it then stores in the global read temperature identification database 206. For example, FIG. 8B illustrates an example of a global logical storage element read temperature map 802 that may have been generated by the global read temperature identification engine 204 via concatenation of the local logical storage element read temperature maps 700 and 702 discussed above with reference to FIGS. 7A and 7B, and then stored by the global read temperature identification engine 204 in its global read temperature identification database 312.

However, one of skill in the art in possession of the present disclosure will appreciate how the generation of a global logical storage element read temperature map via concatenation of local logical storage element read temperature maps provides a simplified example of the use of local logical storage element read temperature maps to generate a global logical storage element read temperature map, and that the local logical storage element read temperature maps discussed above may be utilized to generate the global logical storage element read temperature map in other manners that will fall within the scope of the present disclosure as well. For example, the generation of the global logical storage element read temperature map using the local logical storage element read temperature maps may depend on how the global read temperature identification engine 204 is configured to track read temperatures, how the global read temperature identification engine 204 is configured to organize data (e.g., data may be "striped" across the storage devices 210a-210c), and/or based on other factors that would be apparent to one of skill in the art in possession of the present disclosure.

For example, in some embodiments the computing device 200 may store data in the storage devices 210a-210b independently of each other (e.g., as the logical blocks discussed above), in which case the generation of the global logical storage element read temperature map via concatenation of local logical storage element read temperature maps may be appropriate. However, in other embodiments, the computing device 200 may utilize more complex software that organizes the storage of the data in the storage devices 210a-210c in "groups" of logical blocks. For example, for performance considerations a data group of data A, B, and C may be provided by three respective logical blocks, and may be written to each of three respective storage devices, but the computing device 200 may view that data group as "atomic" such that the read temperature that matters is the read temperature of that data group. In such an embodiment, a "higher level" "group global logical storage element read temperature map" may be generated in order to allow the tracking of data group read temperatures, and the inventors of the present disclosure are developing techniques for doing so. One example of such an embodiment is a Redundant Array of Independent Drives (RAID) storage system, but one of skill in the art in possession of the present disclosure will appreciate that other storage systems may introduce similar considerations as well.

Furthermore, the inventors of the present disclosure have developed techniques for generating global logical storage element read temperature maps using local logical storage element read temperature maps which are described in U.S. patent application Ser. No. 17/579,020, filed Jan. 19, 2022, the disclosure of which is incorporated by reference herein in its entirety. As described in that patent document, data in local logical storage element read temperature maps generated by different storage devices may be scaled relative to each other so that the read temperatures of storage locations in different storage devices with different utilizations (e.g., a first storage device with one million reads and a second storage device with ten million reads) may be accurately compared relative to each other (i.e., "hot" storage locations in the first storage device with one million reads may not be "hot" relative to "hot" storage locations in the second storage device with ten million reads).

In some embodiments, a subset of the local logical storage element read temperature maps generated by the storage devices 210a-210c may be retrieved and used by the global read temperature identification engine 204 at block 412. For instance, if the memory system in the computing device 300 does not have sufficient space to store the global logical storage element read temperature map (or for other reasons that memory space is allocated for the storage of other data), a global logical storage element read temperature map may be generated that only identifies logical storage elements with relatively "hot" red temperatures. As such, in some embodiments, the local logical storage element read temperature maps retrieved from the storage devices 210a-210c may only identify logical storage elements having a particular read temperature (e.g., those with relatively "hot" read temperatures), allowing for the generation of the global logical storage element read temperature map identifying logical storage elements with that particular temperature as well. However, in other embodiments, the global read temperature identification engine 204 may be configured to retrieve the local logical storage element read temperature map(s) from the storage devices 210a-210c, and then utilize a filter to generate a filtered global logical storage element read temperature map that identifies particular read temperatures from the local logical storage element read temperature map(s).

In an embodiment, following block 412, the computing device 200 (e.g., the processing system in the computing device 200) may utilize the global logical storage element read temperature map (which may have been stored in the global read temperature identification database 206) in order to provide for the storage of data, movement of data, and/or other data operations that would be apparent to one of skill in the art in possession of the present disclosure. For example, data stored in NAND rows with relatively high read temperatures may be moved to relatively high capability/cost storage devices, data stored in NAND rows with relatively low read temperatures may be moved to relatively low capability/cost storage devices, data stored in NAND rows with relatively intermediate read temperatures may be moved to relatively intermediate capability/cost storage devices, etc. In another example, the computing device 200 (e.g., the processing system in the computing device 200) may utilize the global logical storage element read temperature map in order to perform load balancing (e.g., when the storage devices 210a-210c are the same type of capability/cost storage device, load balancing reads to those storage devices can result in a higher performing storage system (relative to the performance of that storage system without the load balancing). However, while a few specific examples of operations based on identified read temperatures have been described, one of skill in the art in possession of the present disclosure will appreciate how the read temperatures identified in the global logical storage element read temperature map may be utilized to perform any of a variety of read-temperature-based operations while remaining within the scope of the present disclosure as well.

As will be appreciated by one of skill in the art in possession of the present disclosure, global read temperature identification engine 204 that created the global logical storage element read temperature map 802 may perform any of the read-temperature-based operations discussed above. However, one of skill in the art in possession of the present disclosure will also recognize that other subsystems in the computing device 200 (i.e., other than the global read temperature identification engine 204) may perform the read-temperature-based operations discussed above while remaining within the scope of the present disclosure. Furthermore, subsystems outside the computing device 200 may perform the read-temperature-based operations discussed above while remaining within the scope of the present disclosure as well. As such, access to the global logical storage element read temperature map 802 and/or the local logical storage element read temperature maps 700 and 702 may be provided to subsystems other than the storage devices and global read temperature identification engine 204 discussed above, allowing the information stored therein (as well as information used to generated those maps) to be utilized by those other subsystems in any of a variety of manners that will be apparent to one of skill in the art in possession of the present disclosure.

Thus, systems and methods have been described that utilize the read disturb effect that produces noise in adjacent NAND rows when any particular NAND row is read to identify NAND rows that are read more often than other NAND rows and thus have higher "read temperatures" than those other NAND rows. For example, the read-disturb-based read temperature identification system of the present disclosure may include storage device(s) that each determine read disturb information for each block in that storage device, use that read disturb information to identify a subset of rows in at least one block in that storage device that have a higher read temperature than the other rows in the at least one block in that storage device and, based on that identification, generate and store a local logical storage element read temperature map that identifies a subset of logical storage elements associated with that storage device that have a higher read temperature than the other logical storage elements associated with that storage device. A global read temperature identification subsystem coupled to the storage device(s) may then retrieve the local logical storage element read temperature map generated by each of the storage device(s) and use them to generate a global logical storage element read temperature map.

As such, the read disturb effect that happens automatically in response to conventional read operations and that persists across power cycles may be leveraged to generate read temperature maps for storage devices and storage systems, thus addressing many of the issues with conventional read temperature identification systems discussed above. As will be appreciated by one of skill in the art in possession of the present disclosure, systems and methods of the present disclosure allow a determination of the relative read temperatures of data within storage devices by the storage device themselves (i.e., without requiring processing cycles of a host processor in the server device and/or storage system in which they are located), and with the advent of Storage Class Memory (SCM) devices and low-cost NAND devices that is causing the storage landscape to fracture further than it already has, the opportunity and value associated with placing particular data in the most efficient storage media has increased, and may be realized with the novel read-disturb-based read temperature identification techniques described herein.

Figure 9:
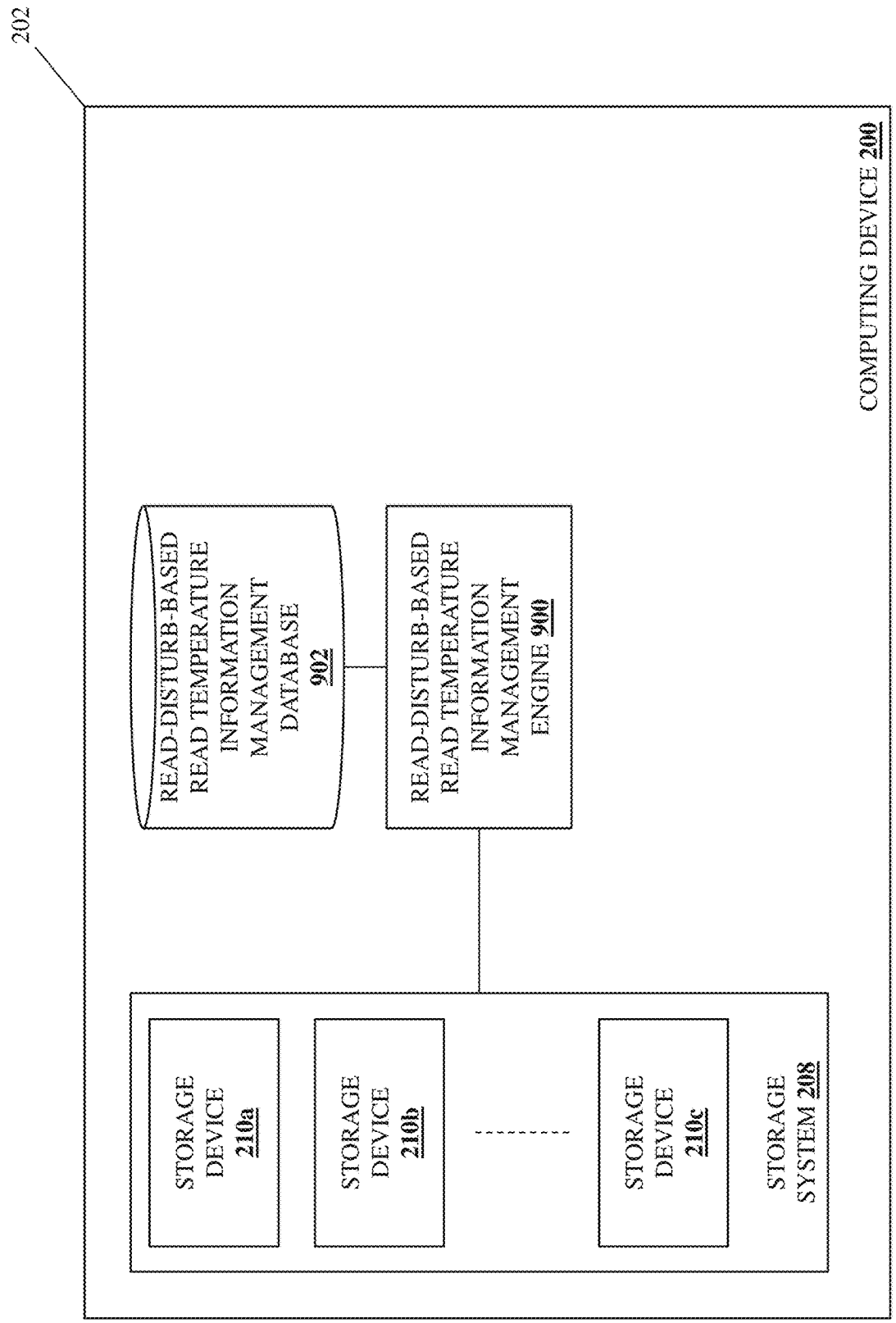
FIG. 9 is a schematic view illustrating an embodiment of a computing device that may utilize the read-disturb-based read temperature information access system of the present disclosure.

Referring now to FIG. 9, an embodiment of the computing device 200 discussed above with reference to FIG. 2 is illustrated. In the embodiments illustrated and discussed below, the memory system in the computing device (not illustrated, but which may include the memory 114 discussed above with reference to FIG. 1) that is coupled to the processing system (not illustrated, but which may include the processor 102 discussed above with reference to FIG. 1) may include instructions that, when executed by the processing system, cause the processing system to provide a read-disturb-based read temperature information management engine 900 that is configured to perform the functionality of the read-disturb-based read temperature information management engines and/or computing devices discussed below. As discussed in further detail below, the read-disturb-based read temperature information management engine 900 may be configured to generate and transmit read-disturb-based read temperature information commands that are configured to utilize a communication interface conforming to a read-disturb-based read temperature information Application Programming Interface (API) provided for the storage devices 210a-210c (i.e., the expansion bus 336 conforming to a read-disturb-based read temperature information API format defined by the read-disturb-based read temperature information API provided for the storage devices 210a-210c). In some examples, the global read temperature identification engine 204 discussed above and the read-disturb-based read temperature information management engine 900 described below may be integrated as part of the same engine, although systems with separate global read temperature identification engines and read-disturb-based read temperature information management engines are envisioned as falling within the scope of the present disclosure as well.

As also illustrated in the specific examples provided herein, the memory system in the computing device (not illustrated, but which may include the memory 114 discussed above with reference to FIG. 1) may also include a read-disturb-based read temperature information management database 902 that is configured to store any of the information utilized by the read-disturb-based read temperature information management engine 900 discussed below. As will be appreciated by one of skill in the art in possession of the present disclosure, the read-disturb-based read temperature information management database 902 may store any information that allows for the generation of read-disturb-based read temperature information commands that are configured to utilize a communication interface conforming to a read-disturb-based read temperature information API provided for the storage devices 210a-210c (i.e., the expansion bus 336 conforming to a read-disturb-based read temperature information API format defined by the read-disturb-based read temperature information API provided for the storage devices 210a-210c).

In some examples, the global read temperature identification database 206 discussed above and the read-disturb-based read temperature information management database 902 described below may be integrated as part of the same database, although systems with separate global read temperature identification databases and read-disturb-based read temperature information management databases are envisioned as falling within the scope of the present disclosure as well. However, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, as well as the functionality discussed below, while remaining within the scope of the present disclosure as well.

Figure 10:
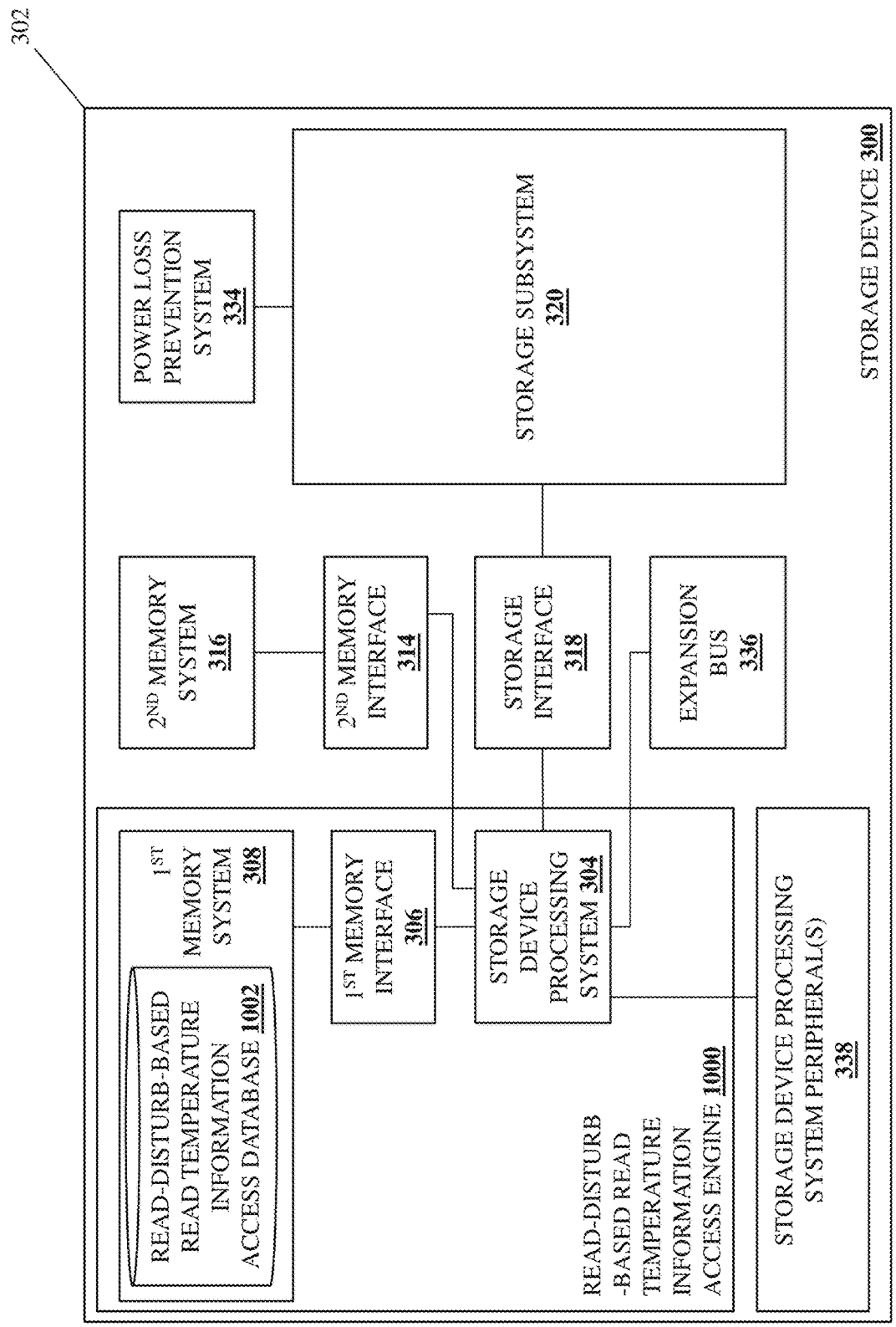
FIG. 10 is a schematic view illustrating an embodiment of a storage device that may be included in the computing device of FIG. 2 and that may provide the read-disturb-based read temperature information access system of the present disclosure.

Referring now to FIG. 10, an embodiment of the storage device 300 discussed above with reference to FIGS. 3A-3E is illustrated. In the embodiments illustrated and discussed below, the first memory system 308 may include instructions that, when executed by the storage processing system 304, cause the storage device processing system 304 to provide a read-disturb-based read temperature information access engine 1000 that is configured to perform the functionality of the read-disturb-based read temperature information access engines and/or storage devices discussed below. As discussed in further detail below, the read-disturb-based read temperature information access engine 1000 may be configured to receive and execute read-disturb-based read temperature information commands that are configured to utilize a communication interface conforming to a read-disturb-based read temperature information API provided for the storage device 300 (i.e., the expansion bus 336 conforming to a read-disturb-based read temperature information API format defined by the read-disturb-based read temperature information API provided for the storage device 300). In one example, the local read temperature identification engine 310 discussed above and the read-disturb-based read temperature information access engine 1000 described below may be integrated as part of the same engine, although systems with separate local read temperature identification engines and read-disturb-based read temperature information access engines are envisioned as falling within the scope of the present disclosure as well.

As also illustrated in the specific examples provided herein, the first memory system 308 may also include a read-disturb-based read temperature information access database 1002 that is configured to store any of the information utilized by the read-disturb-based read temperature information access engine 1000 discussed below. As will be appreciated by one of skill in the art in possession of the present disclosure, the read-disturb-based read temperature information access database 1002 may store any information that allows for the receiving and execution of read-disturb-based read temperature information commands that are configured to utilize a communication interface conforming to a read-disturb-based read temperature information API provided for the storage device 300 (i.e., the expansion bus 336 conforming to a read-disturb-based read temperature information API format defined by the read-disturb-based read temperature information API provided for the storage device 300 and stored in the read temperature information access database 1002).

In one example, the local read temperature identification database 312 discussed above and the read-disturb-based read temperature information access database 1002 described below may be integrated as part of the same database, although systems with separate local read temperature identification databases and read-disturb-based read temperature information access databases are envisioned as falling within the scope of the present disclosure as well. However, while a specific storage device 300 has been illustrated and described, one of skill in the art in possession of the present disclosure will recognize that storage devices (or other devices operating according to the teachings of the present disclosure in a manner similar to that described below for the storage device 300) may include a variety of components and/or component configurations for providing conventional storage device functionality, as well as the functionality discussed below, while remaining within the scope of the present disclosure as well.

Figure 11:
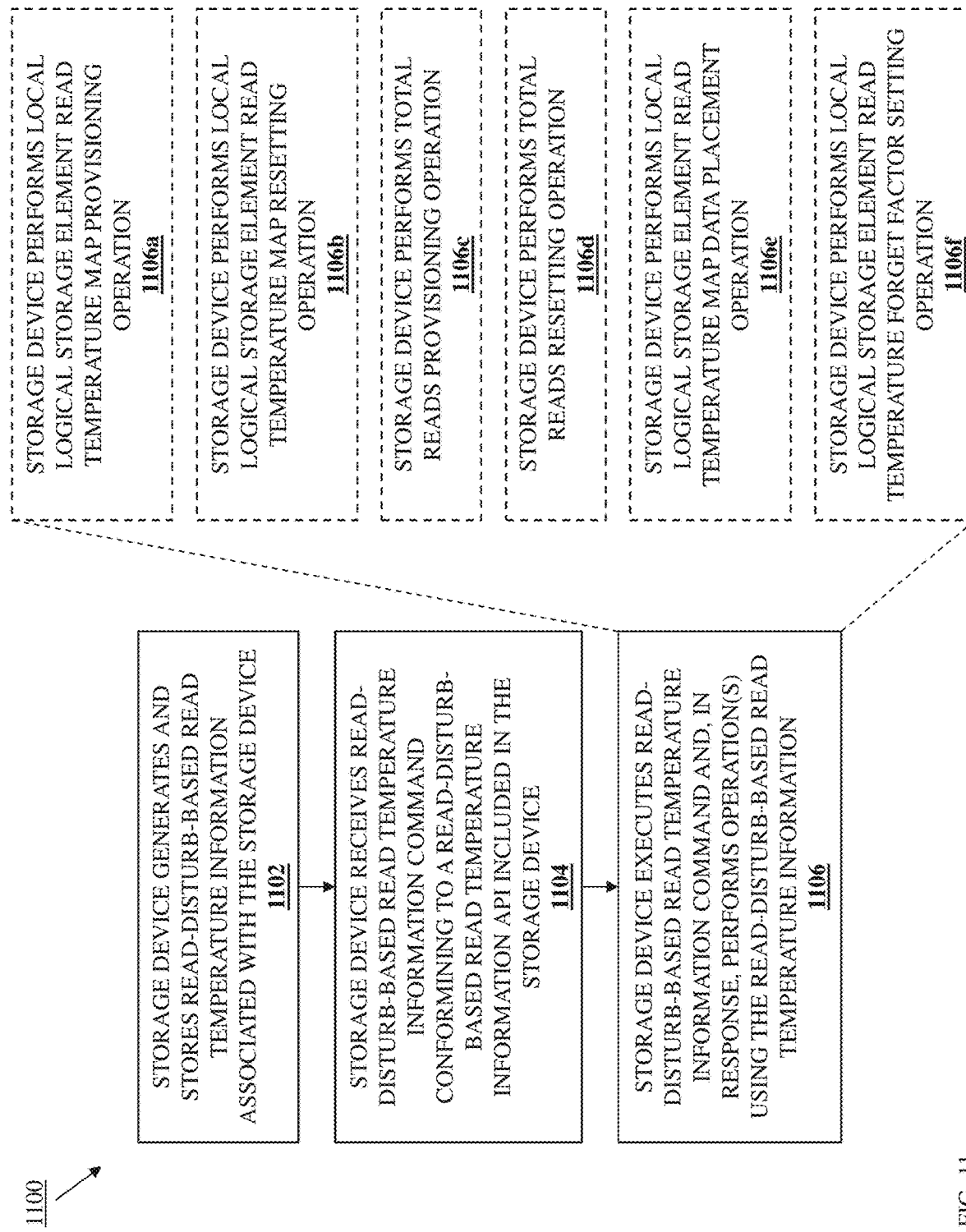
FIG. 11 is a flow chart illustrating an embodiment of a method for providing access to read-disturb-based read temperature information.

With reference to FIG. 11, an embodiment of a method 1100 for providing access to read-disturb-based read temperature information is illustrated. As discussed below, the systems and methods of the present disclosure provide storage devices with a read-disturb-based read temperature information API that allows a read-disturb-based read temperature information management subsystem in the computing device in which those storage devices are located to generate read-disturb-based read temperature information commands and transmit those commands to the storage devices that cause those storage devices to perform operations using their respectively generated read-disturb-based read temperature information. For example, the read-disturb-based read temperature information access system of the present disclosure may include a read-disturb-based read temperature information management subsystem coupled to a plurality of storage devices that each include a read-disturb-based read temperature information API. Each storage device generates and stores read-disturb-based read temperature information associated with that storage device, and when a read-disturb-based read temperature information command is received from the read-disturb-based read temperature information management subsystem that conforms to the read-disturb-based read temperature information API, the storage device receiving that read-disturb-based read temperature information command will execute it to perform at least one operation using the read-disturb-based read temperature information associated with and stored by that storage device.

As discussed below, the read-disturb-based read temperature information access system of the present disclosure allows the read-disturb-based read temperature information management subsystem to retrieve the local logical storage element read temperature maps discussed above (or portions thereof) from any of the storage devices, reset the local logical storage element read temperature maps discussed above in any of the storage devices, retrieve a total number of reads performed on any of the storage devices, reset a total number of reads tracked by any of the storage devices, configure the storage devices to place data using their respective local logical storage element read temperature maps discussed above, set a forget factor for the local logical storage element read temperature maps discussed above generated by any of the storage devices, and/or perform any of a variety of other read-disturb-based read temperature information operations that would be apparent to one of skill in the art in possession of the present disclosure.

The method 1100 begins at block 1102 where a storage device generates and stores read-disturb-based read temperature information associated with the storage device. In the specific examples provided below, the storage device 300 illustrated in FIG. 10 is described as performing the method 1100, and one of skill in the art in possession of the present disclosure will appreciate how that discussion may be applied to any of the storage devices 210a-210c in the computing device 200 illustrated in FIG. 9. Furthermore, one of skill in the art in possession of the present disclosure will appreciate how some embodiments of the present disclosure may provide the read-disturb-based read temperature map generation functionality initially disabled (e.g., by default), and how the read-disturb-based read temperature information API discussed below may be utilized similarly as discussed below to enable that read-disturb-based read temperature map generation functionality, configure that read-disturb-based read temperature map generation functionality, and/or perform any other operations that one of skill in the art in possession of the present disclosure would recognize as allowing for the read-disturb-based read temperature map generation functionality discussed below.

In an embodiment, at block 1102, the storage device 300 may operate to generate and store read-disturb-based read temperature information associated with the storage device 300 in substantially the same manner discussed above with regard to blocks 402-408 of the method 400. As such, the storage device 300 may operate at block 1102 to determine read-disturb information for each of a plurality of blocks in the storage device 300, use that read-disturb information to identify row(s) in block(s) in the storage device 300 that have higher read temperatures than other rows in the block(s) in the storage device 300, generate a local logical storage element read temperature map the identifies subsets of logical storage elements that are associated with the storage device 300 and that have higher read temperatures than other logical storage elements associated with the storage device 300, and store the local logical storage element read temperature map.

Figure 12:
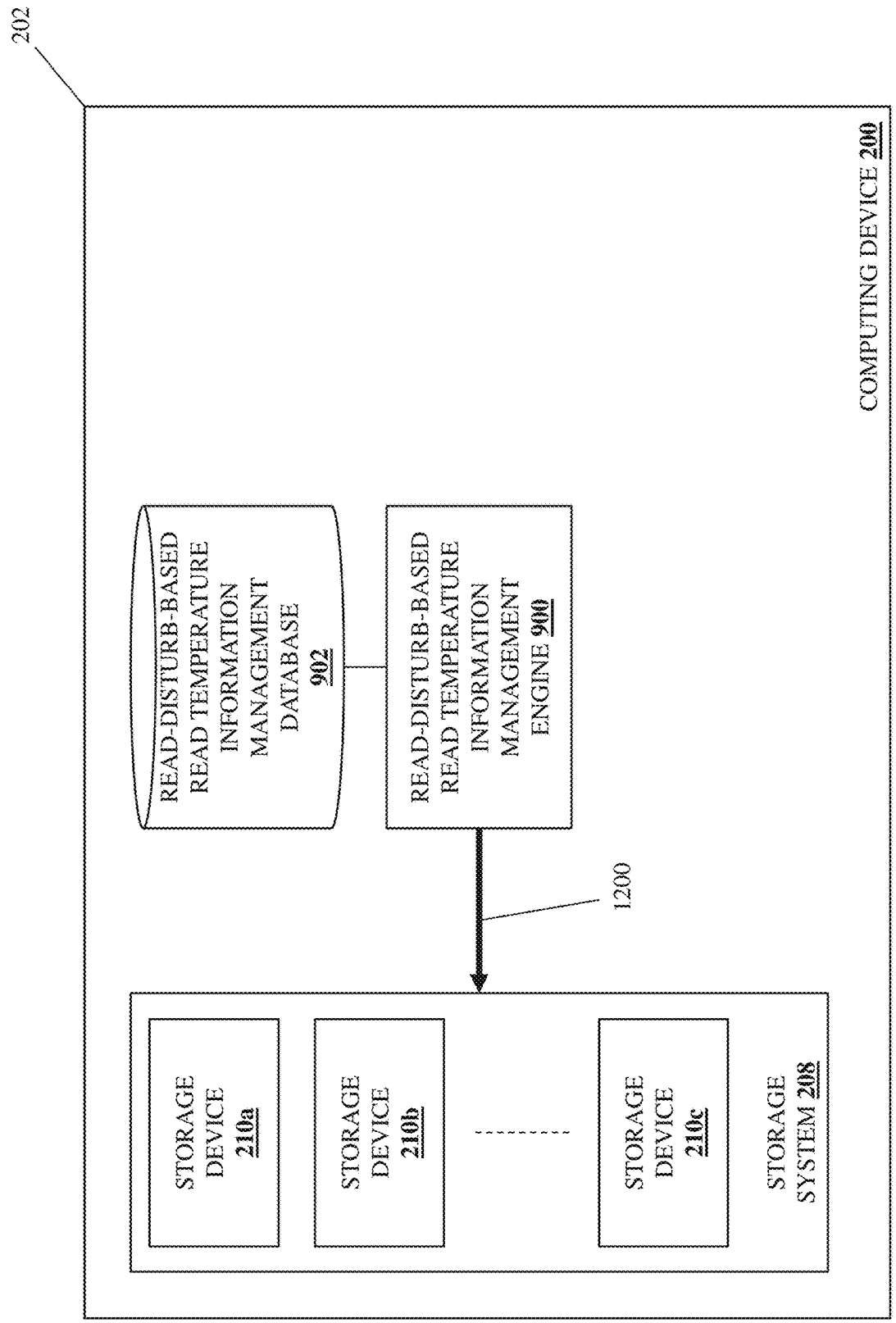
FIG. 12 is a schematic view illustrating an embodiment of the computing device of FIG. 9 operating during the method of FIG. 11.

The method 1100 then proceeds to block 1104 where the storage device receives a read-disturb-based read temperature information command conforming to a read-disturb-based read temperature information API included in the storage device. With reference to FIG. 12, in an embodiment of block 1104, the read-disturb-based read temperature information management engine 900 may perform read-disturb-based read temperature information command generation and transmission operations 1200 that may include generating a read-disturb-based read temperature information command that may include one or more read-disturb-based read temperature information command parameters and that is configured to utilize a communication interface (e.g., the expansion bus 336) conforming to a read-disturb-based read temperature information API provided for each of the storage devices 210a-210c/300, and transmitting that read-disturb-based read temperature information command to the storage device 300 (e.g., via its expansion bus 336) such that the storage device processing system 304 receives the read-disturb-based read temperature information command at block 1104. However, while the expansion bus 336 is illustrated and described as a single interface to the storage device processing system 304, one of skill in the art in possession of the present disclosure will also appreciate that the expansion bus 336 may also provide out-of-band interface(s), side channel interface(s), and/or other interfaces that provide access to the storage device processing system 304 for other systems while remaining within the scope of the present disclosure as well.

In a specific example, the read-disturb-based read temperature information command generated and transmitted by the read-disturb-based read temperature information management engine 900 at block 1104 may be a local logical storage element read temperature map retrieval command that is configured to utilize a communication interface conforming to the read-disturb-based read temperature information API provided for the storage device 300 to retrieve a local logical storage element read temperature map (or a range in (or other subset of) a local logical storage element read temperature map) generated by the storage device 300. In another specific example, the read-disturb-based read temperature information command generated and transmitted by the read-disturb-based read temperature information management engine 900 at block 1104 may be a local logical storage element read temperature map resetting command that is configured to utilize a communication interface conforming to the read-disturb-based read temperature information API provided for the storage device 300 to reset a local logical storage element read temperature map generated by the storage device 300.

In another specific example, the read-disturb-based read temperature information command generated and transmitted by the read-disturb-based read temperature information management engine 900 at block 1104 may be a total reads retrieval command that is configured utilize a communication interface conforming to the read-disturb-based read temperature information API provided for the storage device 300 to retrieve a total number of reads tracked by the storage device 300. In another specific example, the read-disturb-based read temperature information command generated and transmitted by the read-disturb-based read temperature information management engine 900 at block 1104 may be a total reads resetting command that is configured to utilize a communication interface conforming to the read-disturb-based read temperature information API provided for the storage device 300 to reset a total number of reads tracked by the storage device 300.

In another specific example, the read-disturb-based read temperature information command generated and transmitted by the read-disturb-based read temperature information management engine 900 at block 1104 may be a local logical storage element read temperature map data placement activation command that is configured to utilize a communication interface conforming to the read-disturb-based read temperature information API provided for the storage device 300 to activate data placement by the storage device 300 based on the local logical storage element read temperature map generated by the storage device 300. In another specific example, the read-disturb-based read temperature information command generated and transmitted by the read-disturb-based read temperature information management engine 900 at block 1104 may be a local logical storage element read temperature map forget factor setting command that is configured to utilize a communication interface conforming to the read-disturb-based read temperature information API provided for the storage device 300 to set a forget factor for the local logical storage element read temperature map generated by the storage device 300. However, while a few specific examples of specific read-disturb-based read temperature information commands are provided above, one of skill in the art in possession of the present disclosure will recognize how other read-disturb-based read temperature information commands that result in other operations on read-disturb-based read temperature information will fall within the scope of the present disclosure as well.

Figure 13:
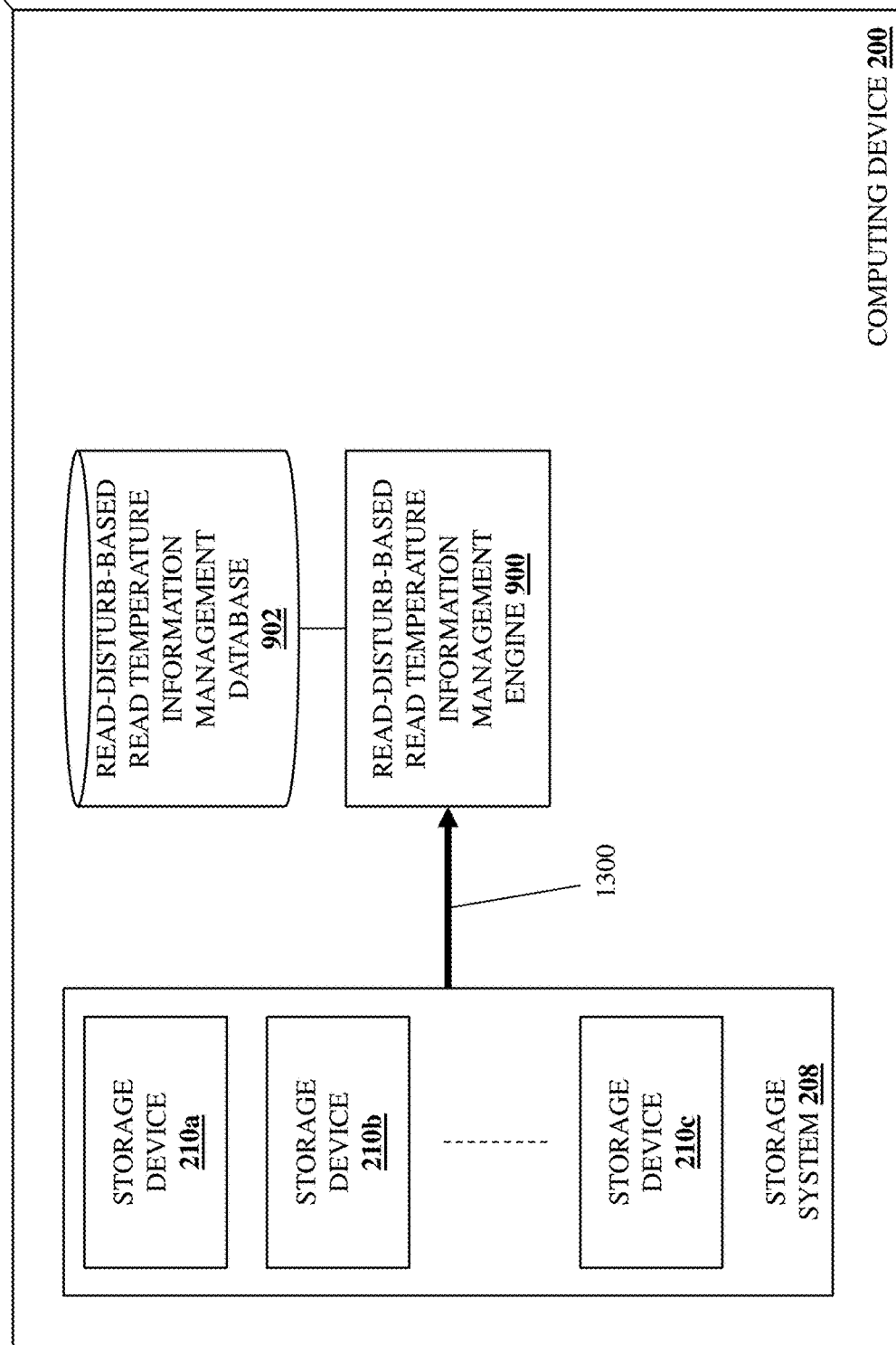
FIG. 13 is a schematic view illustrating an embodiment of the computing device of FIG. 9 operating during the method of FIG. 11.

The method 1100 then proceeds to block 1106 where the storage device executes the read-disturb-based read temperature information command and, in response, performs one or more operations using the read-disturb-based read temperature information. In an embodiment, at block 1106 and in response to receiving the read-disturb-based read temperature information command that is configured to utilize a communication interface conforming to the read-disturb-based read temperature information API provided for the storage device 300, the storage device processing system 304 may execute that read-disturb-based read temperature information command to perform operation(s) using the read-disturb-based read temperature information generated and stored by the storage device 300 at block 1102. With reference to FIG. 13, in some embodiments of block 1006, the operation(s) performed by the storage device processing system 304 in response to executing the read-disturb-based read temperature information command may include read-disturb-based read temperature provisioning operations 1300 that include providing read-disturb-based read temperature information (or read-disturb-based read temperature associated information) to the read-disturb-based read temperature information management engine 900. However, as also discussed below, the operation(s) performed by the storage device processing system 304 in response to executing the read-disturb-based read temperature information command may instead include manipulating read-disturb-based read temperature information generated or utilized by the storage device 300, configuring read-disturb-based read temperature information settings that define how the read-disturb-based read temperature information is generated or utilized, and/or other operation(s) that would be apparent to one of skill in the art in possession of the present disclosure.

As discussed above, the read-disturb-based read temperature information access engine 1000 provided by the storage device processing system 304 may be configured to receive and execute read-disturb-based read temperature information commands that are configured to utilize a communication interface conforming to the read-disturb-based read temperature information API provided for the storage device 300, while the read-disturb-based read temperature information access database 1002 provided by the first memory system 308 may store any information that one of skill in the art in possession of the present disclosure would recognize as allowing for the receiving and execution of read-disturb-based read temperature information commands that are configured to utilize a communication interface conforming to the read-disturb-based read temperature information API provided for the storage device 300 (i.e., conforming to a read-disturb-based read temperature information API format defined by the read-disturb-based read temperature information API provided for the storage device 300 and stored in the read temperature information access database 1002). As such, the read-disturb-based read temperature information access engine 1000 provided by the storage device processing system 304 may utilize any information stored in the read-disturb-based read temperature information access database 1002 provided by the first memory system 308 in order to execute the read-disturb-based read temperature information command at block 1106 to perform operation(s) using the read-disturb-based read temperature information generated and stored by the storage device 300.

For example, block 1106 of the method 1100 may include optional block 1106a in which the operation(s) performed by the storage device using the read-disturb-based read temperature information include local logical storage element read temperature map provisioning operations. In an embodiment, at optional block 1106a, the storage device processing system 304 may execute a local logical storage element read temperature map retrieval command that is provided by the read-disturb-based read temperature information command and that is received via a communication interface conforming to the read-disturb-based read temperature information API provided for the storage device 300 and, in response, may perform a local logical storage element read temperature map provisioning operation that includes retrieving the local logical storage element read temperature map generated by the storage device 300 (e.g., the local logical storage element read temperature map 700 or 702 described above with reference to FIGS. 7A and 7B), and providing that local logical storage element read temperature map to the read-disturb-based read temperature information management engine 900 as part of the read-disturb-based read temperature provisioning operations 1300 illustrated in FIG. 13. As such, the local logical storage element read temperature map retrieval command discussed above may be utilized by the global read temperature identification engine 204 at block 410 of the method 400 to retrieve local logical storage element read temperature maps from any or all of the storage devices 210a-210c.

In specific examples, at optional block 1106a the local logical storage element read temperature map retrieval command may be a local logical storage element read temperature map range retrieval command that is provided by the read-disturb-based read temperature information command and that is received via a communication interface conforming to the read-disturb-based read temperature information API provided for the storage device 300 and, in response to executing that local logical storage element read temperature map range retrieval command, the storage device processing system 304 may perform a local logical storage element read temperature map range provisioning operation that includes retrieving a range (or other subset) of the local logical storage element read temperature map generated by the storage device 300 that is defined by the read-disturb-based read temperature information command parameter(s) in the local logical storage element read temperature map range retrieval command, and providing that local logical storage element read temperature map range to the read-disturb-based read temperature information management engine 900 as part of the read-disturb-based read temperature provisioning operations 1300 illustrated in FIG. 13.

As such, the local logical storage element read temperature map retrieval command discussed above may be utilized by the global read temperature identification engine 204 at block 410 of the method 400 to retrieve portions or subsets of the local logical storage element read temperature maps from each of the storage devices 210a-210c. As will be appreciated by one of skill in the art in possession of the present disclosure, such local logical storage element read temperature map range provisioning operations may allow the read-disturb-based read temperature information management engine 900/global read temperature identification engine 204 to query read temperatures of logical storage elements by logical block ranges, read-temperature ranges, or other logical storage element or data characteristics, enabling (for example) the identification of only logical storage elements having a particular read temperature (e.g., only logical storage elements with a relatively "hot" read temperature, only logical storage elements with a relatively "cold" read temperature, etc.)

In another example, block 1106 of the method 1100 may include optional block 1106b in which the operation(s) performed by the storage device using the read-disturb-based read temperature information include local logical storage element read temperature map resetting operations. In an embodiment, at optional block 1106b, the storage device processing system 304 may execute a local logical storage element read temperature map resetting command that is provided by the read-disturb-based read temperature information command and that is received via a communication interface conforming to the read-disturb-based read temperature information API provided for the storage device 300 and, in response, may perform a local logical storage element read temperature map resetting operation that includes resetting the local logical storage element read temperature map generated by the storage device 300 (e.g., the local logical storage element read temperature map 700 or 702 described above with reference to FIGS. 7A and 7B).

As will be appreciated by one of skill in the art in possession of the present disclosure, such local logical storage element read temperature map resetting operations may allow the read-disturb-based read temperature information management engine 900/global read temperature identification engine 204 to reset local logical storage element read temperature maps generated by storage devices. For example, one of skill in the art in possession of the present disclosure will appreciate that storage devices may only recognize their associated logical storage elements (e.g., LBAs) as "containers", and may not recognize that those containers actually include the same data, may include time-dependent characteristics (e.g., data reads may be dependent on the time of day/month/year, such as data read during election times, data read during holidays, etc.), and/or other data-specific characteristics known in the art. Rather, the "knowledge" of those data specific characteristics may only be present in the host (e.g., the global read temperature identification engine 204/read-disturb-based read temperature information management engine 900) in the computing device 200, and thus it may be that host that is configured to identify factors that would negate (or at least diminish the value of) the read temperature information currently stored for that data and, in response, utilize the local logical storage element read temperature map resetting operations to clear the associated local logical storage element read temperature map.

In specific examples, at optional block 1106b the local logical storage element read temperature map resetting command may be a local logical storage element read temperature map range resetting command that is provided by the read-disturb-based read temperature information command and that is received via a communication interface conforming to the read-disturb-based read temperature information API provided for the storage device 300 and, in response to executing that local logical storage element read temperature map range resetting command, the storage device processing system 304 may perform a local logical storage element read temperature map range resetting operation that includes resetting a range (or other subset) of the local logical storage element read temperature map generated by the storage device 300 that is defined by the read-disturb-based read temperature information command parameter(s) in the local logical storage element read temperature map range resetting command.

As such, the local logical storage element read temperature map resetting command discussed above may be utilized by the global read temperature identification engine 204 at block 410 of the method 400 to reset portions or subsets of the local logical storage element read temperature maps from any of the storage devices 210a-210c. As will be appreciated by one of skill in the art in possession of the present disclosure, such local logical storage element read temperature map range/sub-range resetting operations may include the storage device "erasing" historical read disturb information associated with the local logical storage element read temperature map by, for example, moving data (as the historical read disturb information/metadata is located in the NAND block/NAND row and accumulated in the cells in which that data was stored), or including a bit in a Flash Translation Layer (FTL) map that indicates such historical read-disturb information should not longer be used (while also resetting that historical read-disturb information upon subsequent movement of data from the associated cell(s)).

For example, the read-disturb information associated with data may be contained in both the cell in which data is currently stored (i.e., as the accumulation of fail bit counts since the write of that data to the current NAND row/logical storage element), and recorded as historical accumulated errors for that data (for previous cells in which that data was stored prior to the write of that data to the current NAND row/logical storage element). In different embodiments, local logical storage element read temperature map resetting command discussed above may be executed to reset both of these read-disturb information values by zeroing out values in the local logical storage element read temperature map associated with the logical storage element(s) in different ways. One option is to move the data to a new NAND row/logical storage element, as that new NAND row will start with no read-disturb effect. However, another option is to delay the move of the data (which already has an accumulated read-disturb effect), with further reads of that data increasing its associated read-disturb effect. In such situations, a "negative read-disturb effect" value may be associated with that data (based on the request to reset per the local logical storage element read temperature map resetting command), with a resulting read-disturb information identification for that data utilizing that "negative read-disturb effect" value to identify the read-disturb effect on that data subsequent to that local logical storage element read temperature map resetting command. The inventors of the present disclosure have developed several techniques for manipulating data associated with read-disturb-based read temperatures that are described in U.S. patent application Ser. No. 17/581,785, filed Jan. 21, 2022; U.S. patent application Ser. No. 17/581,677, filed Jan. 21, 2022; the disclosures of which are incorporated by reference herein in their entirety.

Furthermore, read-disturb-based read temperature information may "follow" data as that data is moved to different storage devices in the storage subsystem 320 (e.g., with that read-disturb-based read temperature information provided to that storage device as well). As will be appreciated by one of skill in the art in possession of the present disclosure, moving the read-disturb-based read temperature information as discussed above allows its associated data to be provided with an initial read temperature that was previously determined at another location in the storage subsystem 320.

In another example, block 1106 of the method 1100 may include optional block 1106c in which the operation(s) performed by the storage device using the read-disturb-based read temperature information include total reads provisioning operations. In an embodiment, at optional block 1106c, the storage device processing system 304 may execute a total reads retrieval command that is provided by the read-disturb-based read temperature information command and that is received via a communication interface conforming to the read-disturb-based read temperature information API provided for the storage device 300 and, in response, may perform a total reads provisioning operation that includes a total number of reads tracked by the storage device 300. As will be appreciated by one of skill in the art in possession of the present disclosure, such total reads provisioning operations may allow the read-disturb-based read temperature information management engine 900/global read temperature identification engine 204 to retrieve a total number of reads tracked by each of the storage devices 210a-210c/300, enabling (for example) the normalization of local logical storage element read temperature maps generated by different storage devices that have experienced different numbers of total reads (e.g., by weighting read temperatures based on the total number of reads experienced by the storage device that determined them), and allowing those normalized local logical storage element read temperature maps to be combined into the global logical storage element read temperature map described above in an manner that allows relative read temperatures from different storage devices to be identified (i.e., because a logical storage element with a relatively "hot" read temperature in a storage device read one million times may not be relatively "hot" when compared to a logical storage element with a relatively "hot" read temperature in a storage device read ten million times).

In another example, block 1106 of the method 1100 may include optional block 1106d in which the operation(s) performed by the storage device using the read-disturb-based read temperature information include total reads resetting operations. In an embodiment, at optional block 1106d, the storage device processing system 304 may execute a total reads resetting command that is provided by the read-disturb-based read temperature information command and that is received via a communication interface conforming to the read-disturb-based read temperature information API provided for the storage device 300 and, in response, may perform a total reads resetting operation that includes resetting a total number of reads tracked by the storage device 300. As will be appreciated by one of skill in the art in possession of the present disclosure, such total reads resetting operations may allow the read-disturb-based read temperature information management engine 900/global read temperature identification engine 204 to reset a total number of reads tracked by each of the storage devices 210a-210c/300, enabling (for example) the read-disturb-based read temperature information management engine 900/global read temperature identification engine 204 to reset a total number of reads tracked by any storage device, allowing (for example) for the resetting of a number of reads tracked by a particular storage device (e.g., to "0") when a type of data stored by that storage device changes (e.g., when the storage device is switched from storing video data to storing the "tweet" data described above), and the subsequent tracking of read temperatures of that "new" type of data.

In another example, block 1106 of the method 1100 may include optional block 1106e in which the operation(s) performed by the storage device using the read-disturb-based read temperature information include local logical storage element read temperature map data placement operations. In an embodiment, at optional block 1106e, the storage device processing system 304 may execute a local logical storage element read temperature map data placement activation command that is provided by the read-disturb-based read temperature information command and that is received via a communication interface conforming to the read-disturb-based read temperature information API provided for the storage device 300 and, in response, may perform local logical storage element read temperature map data placement operations that includes placing data in the storage subsystem 320 (e.g., moving existing data within the storage subsystem 320, placing new data in the storage subsystem 320, etc.) based on the local logical storage element read temperature map generated by the storage device 300 (e.g., the local logical storage element read temperature map 700 or 702 described above with reference to FIGS. 7A and 7B).

As will be appreciated by one of skill in the art in possession of the present disclosure, such local logical storage element read temperature map data placement operations allow the storage device 300 to operate as a "smart" storage device that places data in its storage subsystem 320 based on its local logical storage element read temperature map, and enable the read-disturb-based read temperature information management engine 900/global read temperature identification engine 204 to activate such "smart" behavior via the local logical storage element read temperature map data placement activation command described above. The inventors of the present disclosure have developed several techniques for enabling "smart" read-disturb-based read temperature behavior in storage devices that are described in U.S. patent application Ser. No. 17/579,689, filed Jan. 20, 2022; U.S. patent application Ser. No. 17/579,654, filed Jan. 20, 2022; the disclosures of which are incorporated by reference herein in their entirety.

In another example, block 1106 of the method 1100 may include optional block 1106f in which the operation(s) performed by the storage device using the read-disturb-based read temperature information include local logical storage element read temperature forget factor setting operations. In an embodiment, at optional block 1106f, the storage device processing system 304 may execute a local logical storage element read temperature forget factor setting command that is provided by the read-disturb-based read temperature information command and that is received via a communication interface conforming to the read-disturb-based read temperature information API provided for the storage device 300 and, in response, may perform a local logical storage element read temperature forget factor setting operation that includes configuring and/or otherwise setting a "forget factor" for the local logical storage element read temperature map generated by the storage device 300 (e.g., the local logical storage element read temperature map 700 or 702 described above with reference to FIGS. 7A and 7B).

As will be appreciated by one of skill in the art in possession of the present disclosure, such local logical storage element read temperature forget factor setting operations may allow the read-disturb-based read temperature information management engine 900/global read temperature identification engine 204 to set a "forget factor" for the local logical storage element read temperature maps generated by storage devices, enabling those storage devices to generate local logical storage element read temperature maps that identify logical storage elements with more recent relatively "hot" read temperatures (e.g., those storage devices/local logical storage element read temperature maps may be configured via the "forget factor" to weigh logical storage elements with more recent relatively "hot" read temperatures higher than logical storage elements with less recent relatively "hot" read temperatures, i.e., to "forget" those logical storage elements with less recent relatively "hot" read temperatures).

However, while a few specific examples of operations that may be performed by the storage device using the read-disturb-based read temperature information at block 1106 have been described, one of skill in the art in possession of the present disclosure will appreciate how other operations may be performed by the storage device using the read-disturb-based read temperature information at block 1106 while remaining within the scope of the present disclosure as well. For example, the read-disturb-based read temperature information API may be utilized by the read-disturb-based read temperature information management engine 900/global read temperature identification engine 204 and the storage devices 210a-210c/300 to provide, manipulate, or otherwise use any information associated with or based on the read-disturb characteristics of the storage subsystem 320.

In a specific embodiment, the read-disturb-based read temperature information API may be utilized by the read-disturb-based read temperature information management engine 900/global read temperature identification engine 204 and the storage devices 210a-210c/300 to provide read-disturb-based read temperature information "triggers"

in the storage devices 210a-210c/300 that may operate to cause (i.e., "trigger") the storage devices to automatically identify (e.g., to the read-disturb-based read temperature information management engine 900/global read temperature identification engine 204) their logical storage elements that have become "hot", "cold", or have otherwise changed their read temperature (thus preventing the read-disturb-based read temperature information management engine 900/global read temperature identification engine 204 from having to poll or otherwise request information from those storage devices 210a-210c/300 above a desired interval).

In another specific embodiment, the read-disturb-based read temperature information API may be utilized by the read-disturb-based read temperature information management engine 900/global read temperature identification engine 204 and the storage devices 210a-210c/300 to configure the storage devices 210a-210c/300 to measure read temperature statistics (e.g., to identify a read temperature mode, a read temperature median, a $3^{rd}$ order read temperature moment, an identification of whether the read-temperature statistics are bi-modal, etc.) and report those read temperature statistics, take action(s) based on those read temperature statistics, and/or utilize those read temperature statistics in any other manner that would be apparent to one of skill in the art in possession of the present disclosure. In such examples, each storage device may include a separate read temperature statistics engine that is configured to generate those read temperature statistics, and the read-disturb-based read temperature information API may be utilized to enable or access those read temperature statistics.

Furthermore, while the read-disturb-based read temperature information API is described above as being utilized by the read-disturb-based read temperature information management engine 900/global read temperature identification engine 204 to cause operations to be performed using read-disturb-based read temperature information generated by the storage devices 210a-210c, one of skill in the art in possession of the present disclosure will appreciate how other subsystems in the computing device 200 (e.g., other processors in the computing device 200) or outside the computing device 200 may use the read-disturb-based read temperature information API in a similar manner (e.g., via the out-of-band/side channel interfaces described above) while remaining within the scope of the present disclosure as well. For example, subsystems that have no access to the actual data stored in the storage devices 210a-210c may be configured to utilize the read-disturb-based read temperature information API to cause operations to be performed using read-disturb-based read temperature information generated by the storage devices 210a-210c while remaining within the scope of the present disclosure.

Further still, while the read-disturb-based read temperature information API is described above as being utilized by the read-disturb-based read temperature information management engine 900/global read temperature identification engine 204 to cause operations to be performed using read-disturb-based read temperature information generated by the storage devices 210a-210c, one of skill in the art in possession of the present disclosure will appreciate how the API described above may provide benefits with non-read-disturb-based read temperature information. For example, storage devices may be configured to identify read temperatures using other techniques (i.e., other than based on the read disturb effect as described above), and then allow the host (e.g., a processing system in the computing device that includes those storage devices) to access, manipulate, and configure that read temperature information (or how that read temperature information is collected) substantially as described above using a read temperature information API that operates similarly to the read-disturb-based read temperature information API described above.

Thus, systems and methods have been described that provide storage devices with a read-disturb-based read temperature information API that allows a read-disturb-based read temperature information management subsystem in the computing device in which those storage devices are located to generate read-disturb-based read temperature information commands and transmit those commands to the storage devices that cause those storage devices to perform operations using their respectively generated read-disturb-based read temperature information. For example, the read-disturb-based read temperature information access system of the present disclosure may include a read-disturb-based read temperature information management subsystem coupled to a plurality of storage devices that each include a read-disturb-based read temperature information API. Each storage device generates and stores read-disturb-based read temperature information associated with that storage device, and when a read-disturb-based read temperature information command is received from the read-disturb-based read temperature information management subsystem that conforms to the read-disturb-based read temperature information API, the storage device receiving that read-disturb-based read temperature information command will execute it to perform at least one operation using the read-disturb-based read temperature information associated with and stored by that storage device. As such, any or all of the read-disturb-based read temperature information generated by a storage device may be retrieved, manipulated, and/or configured using the read-disturb-based read temperature information API described herein.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A read-disturb-based read temperature information access system, comprising:
a read-disturb-based read temperature information management subsystem; and
a plurality of storage devices that are each coupled to the read-disturb-based read temperature information management subsystem and that each include a read-disturb-based read temperature information Application Programming Interface (API), wherein each of the plurality of storage devices is configured to:
identify, using valid data and obsolete data in at least one physical block in that storage device, read disturb information associated with a plurality of rows provided by the at least one physical block in that storage device;
map the read disturb information associated with the plurality of rows provided by the at least one physical block in that storage device to one or more logical storage elements included in a logical-to-physical storage element mapping for that storage device to generate a local logical storage element read temperature map associated with that storage device;
receive, from the read-disturb-based read temperature information management subsystem, a read-disturbbased read temperature information command that conforms to the read-disturb-based read temperature information API; and execute the read-disturb-based read temperature information command that conforms to the read-disturb-based read temperature information API and, in response, perform at least one operation using the local logical storage element read temperature map associated with and stored by that storage device.

2. The system of claim 1, wherein the at least one operation performed using the local logical storage element read temperature map includes a local logical storage element read temperature map provisioning operation that provides the local logical storage element read temperature map to the read-disturb-based read temperature information management subsystem.

3. The system of claim 1, wherein the at least one operation performed using the local logical storage element read temperature map includes a local logical storage element read temperature map range provisioning operation that provides a logical storage element range of the local logical storage element read temperature map to the read-disturb-based read temperature information management subsystem.

4. The system of claim 1, wherein the at least one operation performed using the local logical storage element read temperature map includes a local logical storage element read temperature map resetting operation that resets the local logical storage element read temperature map.

5. The system of claim 1, wherein each of the plurality of storage devices is configured to:

execute the read-disturb-based read temperature information command that conforms to the read-disturb-based read temperature information API and, in response, provide a total number of reads associated with that storage device to the read-disturb-based read temperature information management subsystem.

6. The system of claim 1, wherein each of the plurality of storage devices is configured to:

execute the read-disturb-based read temperature information command that conforms to the read-disturb-based read temperature information API and, in response, reset a total number of reads associated with that storage device.

7. The system of claim 1, wherein the at least one operation performed using the local logical storage element read temperature map includes a local logical storage element read temperature map data placement operation that uses the local logical storage element read temperature map to place data in particular storage locations in one of the plurality of storage devices based on the read temperatures identified in the local logical storage element read temperature map.

8. A storage device, comprising:

a processing system; and a memory system that is coupled to the processing system and that includes instructions that, when executed by the processing system, cause the processing system to provide a read-disturb-based read temperature information access engine that includes a read-disturb-based read temperature information Application Programming Interface (API) and that is configured to:

identify, using valid data and obsolete data in at least one physical block in a storage device, read disturb information associated with a plurality of rows provided by the at least one physical block in the storage device;

map the read disturb information associated with the plurality of rows provided by the at least one physical block in the storage device to one or more logical storage elements included in a logical-to-physical storage element mapping for the storage device to generate a local logical storage element read temperature map associated with the storage device;

receive, from a read-disturb-based read temperature information management subsystem, a read-disturb-based read temperature information command that conforms to the read-disturb-based read temperature information API; and execute the read-disturb-based read temperature information command that conforms to the read-disturb-based read temperature information API and, in response, perform at least one operation using the local logical storage element read temperature map associated with and stored by the storage device.

9. The storage device of claim 8, wherein the at least one operation performed using the local logical storage element read temperature map includes a local logical storage element read temperature map provisioning operation that provides either 1) the local logical storage element read temperature map to the read-disturb-based read temperature information management subsystem, or 2) a logical storage element range of the local logical storage element read temperature map to the read-disturb-based read temperature information management subsystem.

10. The storage device of claim 8, wherein the at least one operation performed using the local logical storage element read temperature map includes a local logical storage element read temperature map resetting operation that resets the local logical storage element read temperature map.

11. The storage device of claim 8, wherein the read-disturb-based read temperature information access engine is configured to:

execute the read-disturb-based read temperature information command that conforms to the read-disturb-based read temperature information API and, in response, provide a total number of reads associated with the storage device to the read-disturb-based read temperature information management subsystem.

12. The storage device of claim 8, wherein the read-disturb-based read temperature information access engine is configured to:

execute the read-disturb-based read temperature information command that conforms to the read-disturb-based read temperature information API and, in response, reset a total number of reads associated with the storage device.

13. The storage device of claim 8, wherein the at least one operation performed using the local logical storage element read temperature map includes a local logical storage element read temperature map data placement operation that uses the local logical storage element read temperature map to place data in particular storage locations in the storage device based on the read temperatures identified in the local logical storage element read temperature map.

14. A method for providing access to read-disturb-based read temperature information, comprising:

identifying, by a storage device that includes a read-disturb-based read temperature information Application Programming Interface (API) and using valid data and obsolete data in at least one physical block in the storage device, read disturb information associated with a plurality of rows provided by the at least one physical block in the storage device;

mapping, by the storage device, the read disturb information associated with the plurality of rows provided by the at least one physical block in the storage device to one or more logical storage elements included in a logical-to-physical storage element mapping for the storage device to generate a local logical storage element read temperature map associated with the storage device;

receiving, by the storage device from a read-disturb-based read temperature information management subsystem, a read-disturb-based read temperature information command that conforms to the read-disturb-based read temperature information API; and executing, by the storage device, the read-disturb-based read temperature information command that conforms to the read-disturb-based read temperature information API and, in response, performing at least one operation using the local logical storage element read temperature map associated with and stored by the storage device.

15. The method of claim 14, wherein the at least one operation performed using the local logical storage element read temperature map includes a local logical storage element read temperature map provisioning operation that provides the local logical storage element read temperature map to the read-disturb-based read temperature information management subsystem.

16. The method of claim 14, wherein the at least one operation performed using the local logical storage element read temperature map includes a local logical storage element read temperature map range provisioning operation that provides a logical storage element range of the local logical storage element read temperature map to the read-disturb-based read temperature information management subsystem.

17. The method of claim 14, wherein the at least one operation performed using the local logical storage element read temperature map includes a local logical storage element read temperature map resetting operation that resets the local logical storage element read temperature map.

18. The method of claim 14, further comprising:
executing, by the storage device, the read-disturb-based read temperature information command that conforms to the read-disturb-based read temperature information API and, in response, providing a total number of reads associated with the storage device to the read-disturb-based read temperature information management subsystem.

19. The method of claim 14, further comprising:
executing, by the storage device, the read-disturb-based read temperature information command that conforms to the read-disturb-based read temperature information API and, in response, resetting a total number of reads associated with the storage device.

20. The method of claim 14, wherein the at least one operation performed using the local logical storage element read temperature map includes a local logical storage element read temperature map data placement operation that uses the local logical storage element read temperature map to place data in particular storage locations in the storage device based on the read temperatures identified in the local logical storage element read temperature map.

* * * * *